United States Patent
Minoura et al.

(10) Patent No.: US 9,947,781 B2
(45) Date of Patent: Apr. 17, 2018

(54) SEMICONDUCTOR DEVICE AND MANUFACTURING METHOD THEREOF

(71) Applicant: FUJITSU LIMITED, Kawasaki-shi, Kanagawa (JP)

(72) Inventors: Yuichi Minoura, Zama (JP); Naoya Okamoto, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/636,930

(22) Filed: Jun. 29, 2017

(65) Prior Publication Data

US 2017/0309737 A1    Oct. 26, 2017

Related U.S. Application Data

(62) Division of application No. 15/058,747, filed on Mar. 2, 2016, now Pat. No. 9,728,618, which is a division
(Continued)

(30) Foreign Application Priority Data

May 24, 2013    (JP) .................................. 2013-110373

(51) Int. Cl.
*H01L 29/15*    (2006.01)
*H01L 31/0256*    (2006.01)
(Continued)

(52) U.S. Cl.
CPC ........ *H01L 29/7787* (2013.01); *H01L 29/045* (2013.01); *H01L 29/205* (2013.01);
(Continued)

(58) Field of Classification Search
CPC ............. H01L 29/7787; H01L 29/4236; H01L 29/66446; H01L 29/66734; H01L 29/7813;
(Continued)

(56) References Cited

U.S. PATENT DOCUMENTS

| 6,410,947 B1 | 6/2002 | Wada |
| 2005/0023555 A1 | 2/2005 | Yoshida et al. |

(Continued)

FOREIGN PATENT DOCUMENTS

| CN | 1265225 A | 8/2000 |
| JP | 2002-353446 A | 12/2002 |

(Continued)

OTHER PUBLICATIONS

Chinese Patent Application No. 201410171412.1: Office Action dated Sep. 1, 2016.
(Continued)

*Primary Examiner* — Stephen W Smoot
*Assistant Examiner* — Vicki B Booker
(74) *Attorney, Agent, or Firm* — Krantz, Quintos & Hanson, LLP

(57) ABSTRACT

A semiconductor device includes a first semiconductor layer formed of a nitride semiconductor on a substrate, a second semiconductor layer formed of a nitride semiconductor on the first semiconductor layer, a gate trench formed in the second semiconductor layer or in the second and first semiconductor layers, a gate electrode formed at the gate trench, and a source electrode and a drain electrode formed on the second semiconductor layer. The gate trench has terminal parts of a bottom of the gate trench formed shallower than a center part of the bottom. A part of a sidewall of the gate trench is formed of a surface including an a-plane. The center part of the bottom is a c-plane. The terminal parts of the bottom form a slope from the c-plane to the a-plane.

5 Claims, 28 Drawing Sheets

Related U.S. Application Data of application No. 14/248,727, filed on Apr. 9, 2014, now Pat. No. 9,312,350.

(51) Int. Cl.

| | | |
|---|---|---|
| *H01L 29/778* | (2006.01) | |
| *H01L 29/423* | (2006.01) | |
| *H01L 29/66* | (2006.01) | |
| *H01L 29/78* | (2006.01) | |
| *H01L 29/205* | (2006.01) | |
| *H01L 29/04* | (2006.01) | |
| H01L 29/20 | (2006.01) | |
| H01L 29/417 | (2006.01) | |

(52) U.S. Cl.
CPC .... *H01L 29/4236* (2013.01); *H01L 29/42376* (2013.01); *H01L 29/66446* (2013.01); *H01L 29/66462* (2013.01); *H01L 29/66734* (2013.01); *H01L 29/7786* (2013.01); *H01L 29/7813* (2013.01); *H01L 29/2003* (2013.01); *H01L 29/41758* (2013.01); *H01L 29/4238* (2013.01)

(58) Field of Classification Search
CPC ......... H01L 29/42376; H01L 29/66462; H01L 29/7786; H01L 29/045; H01L 29/205; H01L 29/2003; H01L 29/4238; H01L 29/41758

See application file for complete search history.

(56) References Cited

U.S. PATENT DOCUMENTS

| | | |
|---|---|---|
| 2005/0139838 A1 | 6/2005 | Murata et al. |
| 2007/0114567 A1 | 5/2007 | Matocha et al. |
| 2009/0039421 A1 | 2/2009 | Otake |
| 2009/0050937 A1 | 2/2009 | Murata et al. |
| 2009/0179227 A1 | 7/2009 | Otake et al. |
| 2010/0078688 A1* | 4/2010 | Otake ............... H01L 29/66666 257/288 |
| 2010/0129992 A1 | 5/2010 | Murata et al. |
| 2011/0062438 A1 | 3/2011 | Kaneko |
| 2012/0146046 A1 | 6/2012 | Ohki et al. |

FOREIGN PATENT DOCUMENTS

| | | |
|---|---|---|
| JP | 2002-359256 A | 12/2002 |
| JP | 2004-327766 A | 11/2004 |
| JP | 2005-210105 A | 8/2005 |
| JP | 2008-311489 A | 12/2008 |
| JP | 2010-062381 A | 3/2010 |
| JP | 2012-124442 A | 6/2012 |
| JP | 2012-169470 A | 9/2012 |
| WO | 98/53489 A2 | 11/1998 |
| WO | 2008/093824 A1 | 8/2008 |

OTHER PUBLICATIONS

Japanese Patent Application No. 2013-110373: Office Action dated Nov. 15, 2016.

* cited by examiner

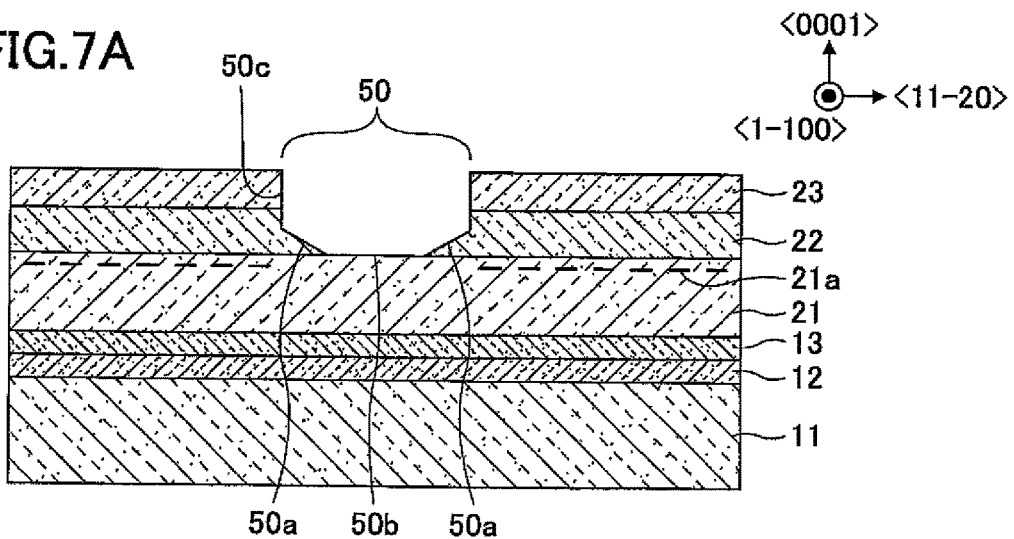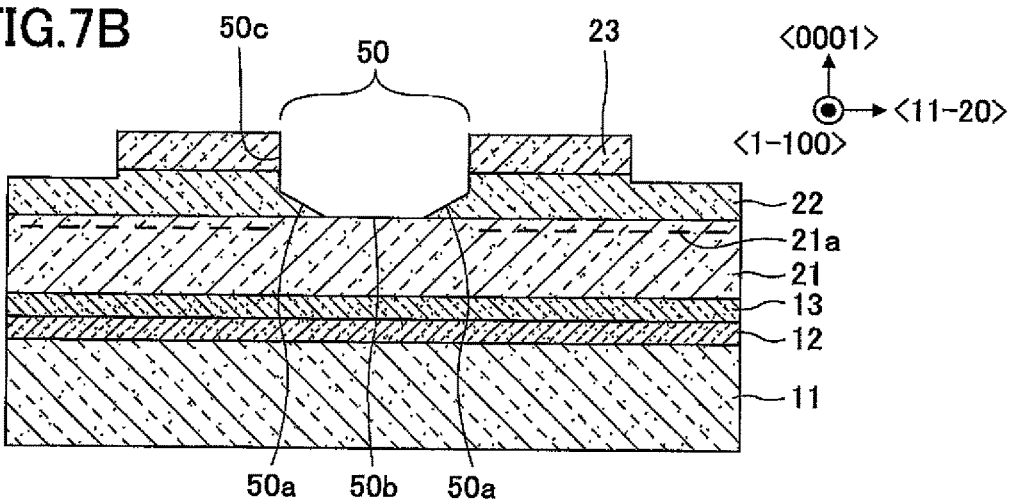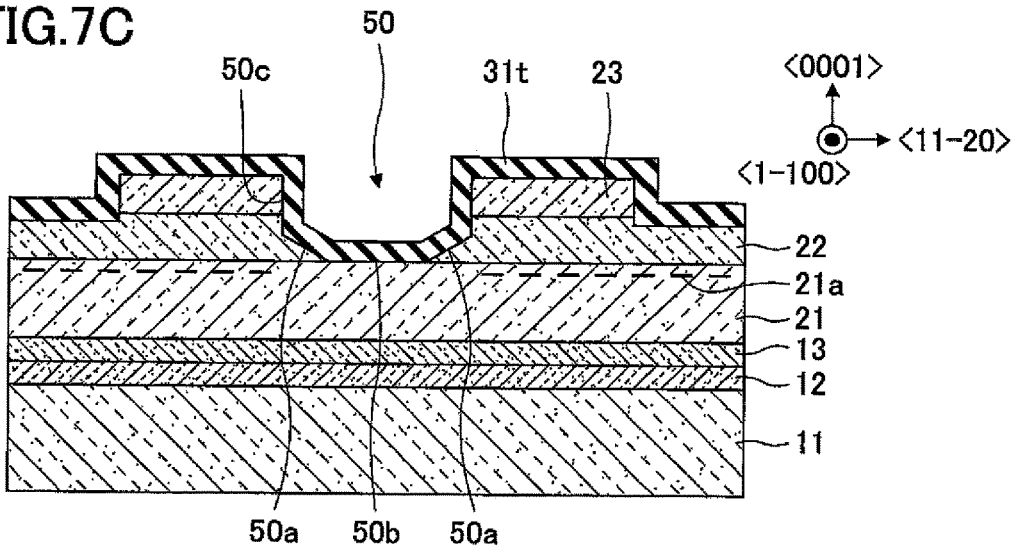

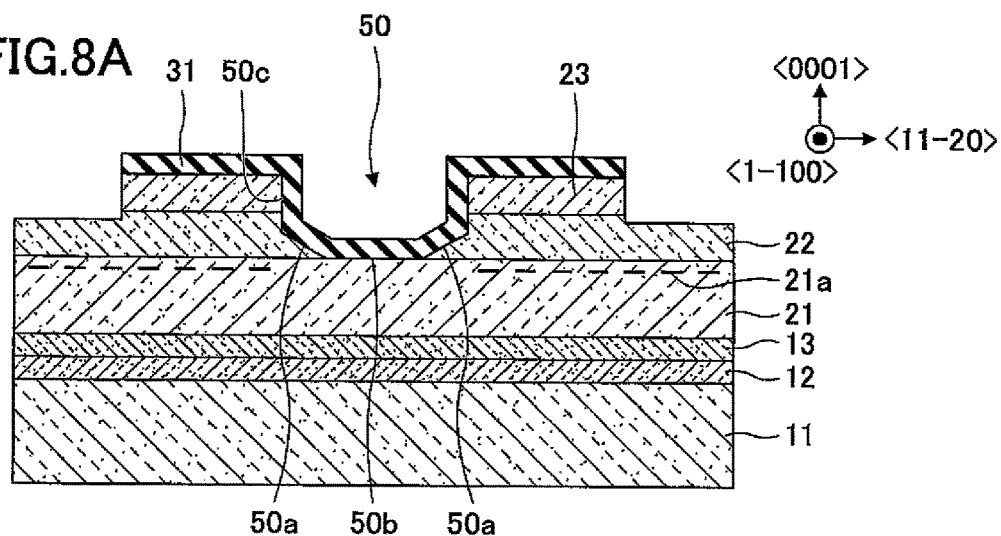
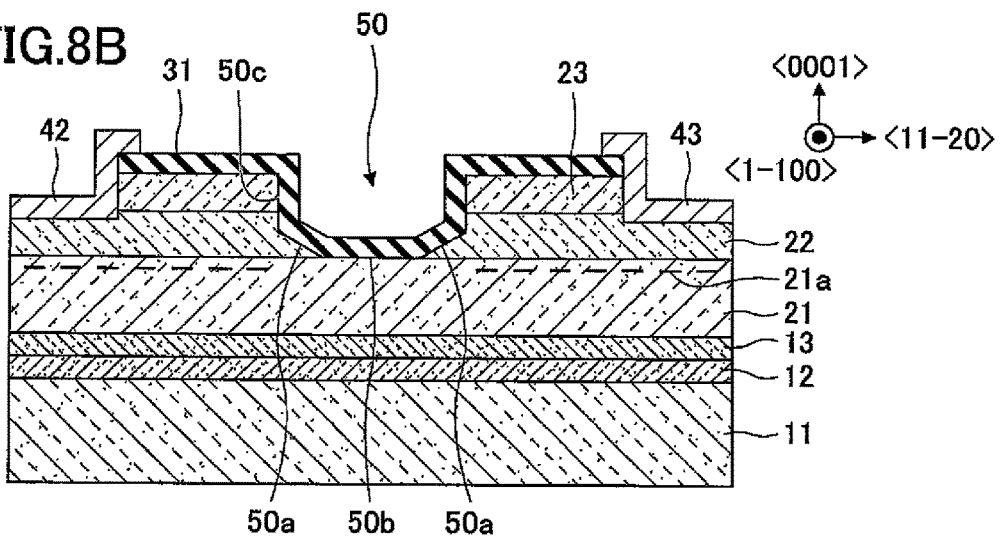
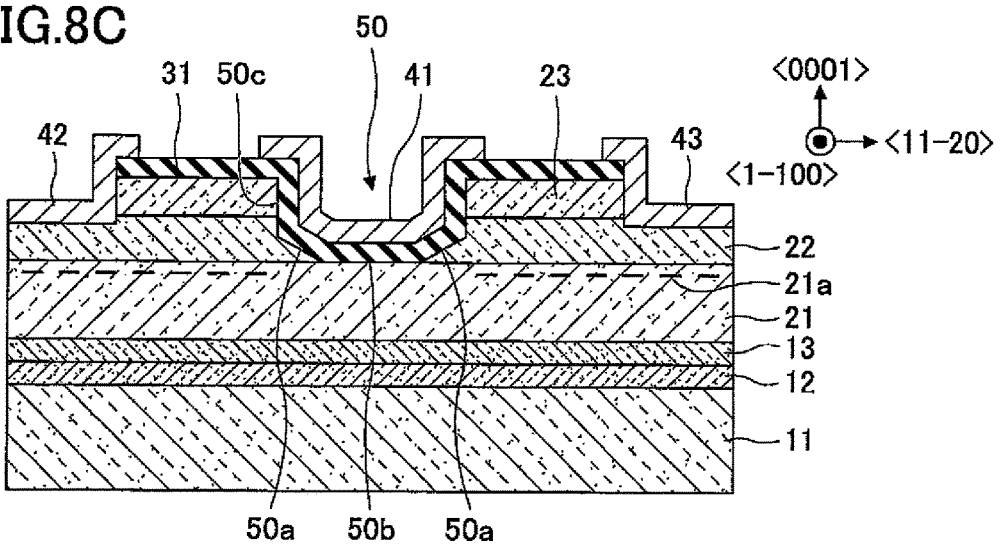

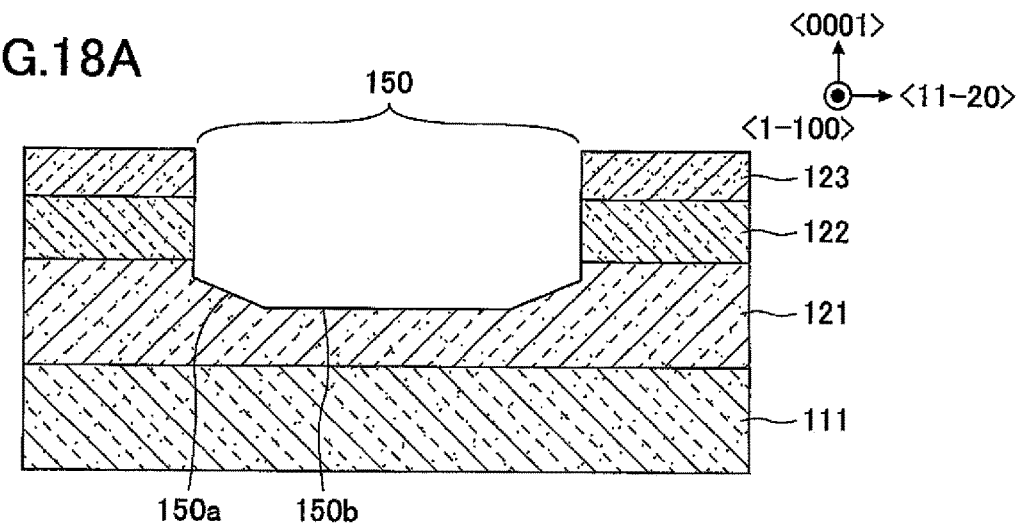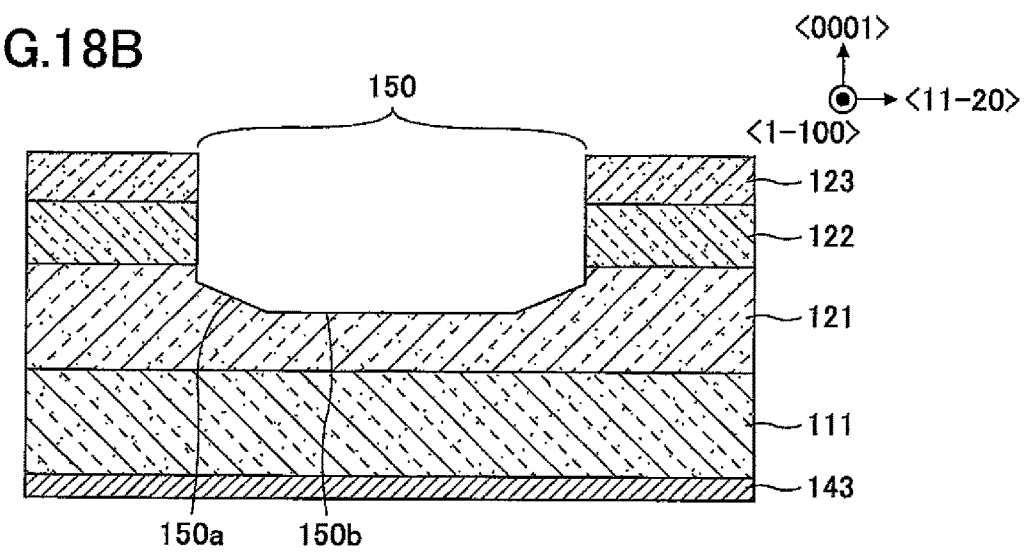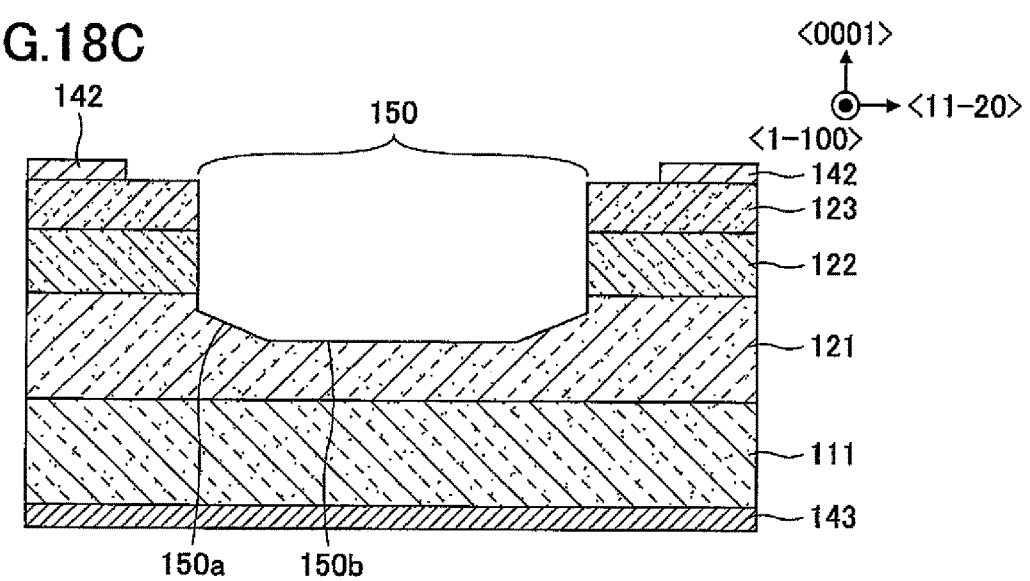

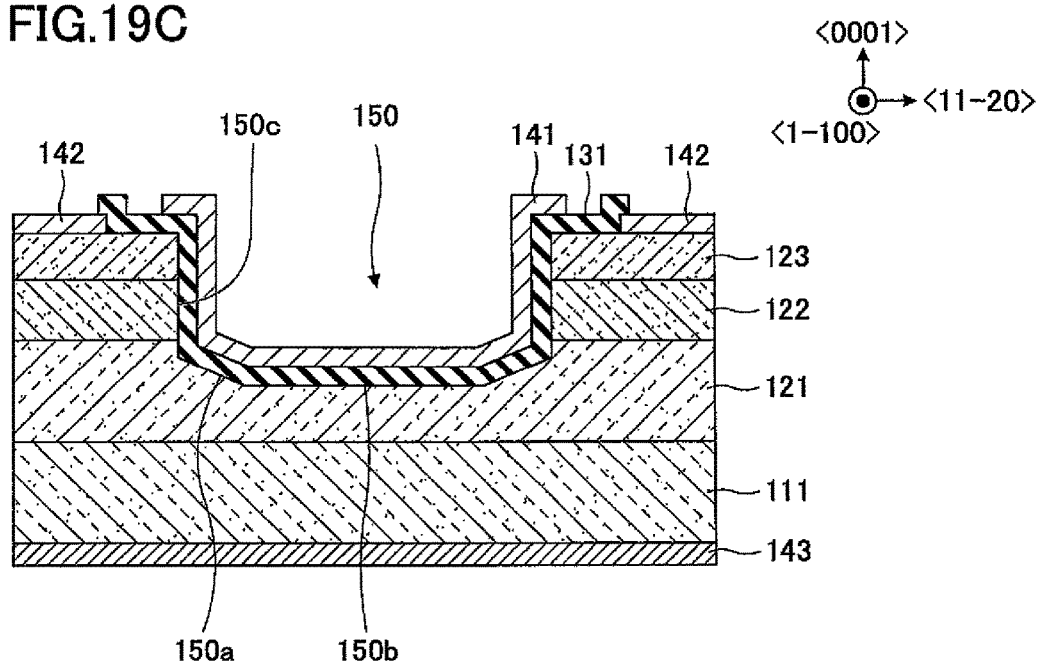

SEMICONDUCTOR DEVICE AND MANUFACTURING METHOD THEREOF

CROSS-REFERENCE TO RELATED APPLICATIONS

This application is a divisional application of U.S. application Ser. No. 15/058,747, filed Mar. 2, 2016, which is a divisional application of U.S. application Ser. No. 14/248,727, filed Apr. 9, 2014, which claims benefit to Japanese Application 2013-110373, filed May 24, 2013, the entire contents of which are incorporated herein by reference in their entireties.

FIELD

The disclosures herein generally relate to a semiconductor device and a manufacturing method thereof.

BACKGROUND

Nitride semiconductors such as GaN, AlN, and InN, or mixed crystals of these materials have wide band gaps, and are used as high-output electronic devices, short-wavelength light-emitting devices, and the like. To be used as high-output devices, technologies relating to field-effect transistors (FET), especially, high electron mobility transistors (HEMT), have been developed (see, for example, Patent Document 1). A HEMT that uses such a nitride semiconductor is used for a high-output, high-efficiency amplifier, a high-power switching device, or the like.

Incidentally, normally-off is required as one of the characteristics for a high-output, high-efficiency amplifier, a switching device, and the like. Also, normally-off is important from a safety operation point of view. However, in a HEMT using GaN, it is considered difficult to realize normally-off because the density of electrons is extremely high in 2 DEG (Two-Dimensional Electron Gas) generated in an electron transit layer due to piezoelectric polarization and spontaneous polarization in GaN. Therefore, various methods are under investigation to realize normally-off for a HEMT using GaN.

One of the methods to realize normally-off for a HEMT is a method that forms a gate recess. Specifically, the method forms a recess in an electron supply layer immediately below a gate electrode to make 2 DEG disappear in the region immediately below the gate electrode to realize normally-off.

Also, as one of the semiconductor devices using a nitride semiconductor, there is a transistor that has a UMOS (U Metal Oxide Semiconductor) structure in which a U-shaped opening is formed in stacked nitride semiconductor layers, and an oxide film is formed on the opening.

RELATED-ART DOCUMENTS

Patent Documents

[Patent Document 1] Japanese Laid-open Patent Publication No. 2002-359256
[Patent Document 2] Japanese Laid-open Patent Publication No. 2012-124442
[Patent Document 3] Japanese Laid-open Patent Publication No. 2010-62381

Incidentally, when forming a gate recess in a HEMT, the gate recess is formed by removing a part of nitride semiconductor layers by dry etching in general. FIG. 1 illustrates a HEMT in which a gate recess is formed by dry etching. The HEMT has layers formed on a substrate 811 that include an electron transit layer 821 made of GaN, an electron supply layer 822 made of AlGaN, and a cap layer 823 made of n-GaN stacked in this order. Also, immediately below a region where a gate electrode 841 is formed, a gate recess 850 is formed by removing a part of the cap layer 823 and the electron supply layer 822 by dry etching. The gate electrode 841 is formed on the sidewall and bottom of the inside of the gate recess 850 formed as above, having an insulation layer 831 layered in-between as a gate insulation film. Note that a source electrode 842 and a drain electrode 843 are formed contacting the electron supply layer 822.

In the HEMT having such a structure, the electron supply layer 822 has less thickness immediately below the gate electrode 841 because the gate recess 850 is formed. Therefore, although 2 DEG 821a is generated in the neighborhood of an interface between the electron transit layer 821 and the electron supply layer 822 in the electron transit layer 821, the 2 DEG 821a disappears immediately below the gate electrode 841 because the electron supply layer 822 has less thickness there. This makes it possible to realize normally-off in the HEMT.

Incidentally, in the HEMT having the above structure, when forming the gate recess 850 by dry etching, the underlying layer is removed more at terminal parts 850a of the bottom of the gate recess 850 than at other parts of the bottom such as a center part 850b. Namely, the terminal parts 850a of the bottom of the gate recess 850 are formed deeper than the other parts of the bottom such as the center part 850b. This phenomenon is an inherent problem that arises when forming a gate recess by dry etching in a nitride semiconductor. If a voltage is applied to the device in which the terminal parts 850a of the bottom of the gate recess 850 is formed deeper than the center part 850b of the bottom, an electric field is concentrated in the terminal parts 850a of the bottom of the gate recess 850. This causes destruction in the terminal parts 850a of the bottom of the gate recess 850, which reduces reliability.

Also, when forming an opening in a transistor having a UMOS structure, the opening is formed by removing a part of nitride semiconductor layers by dry etching in general. FIG. 2 illustrates a transistor having a UMOS structure in which an opening is formed by dry etching. The transistor having the UMOS structure has layers formed on the surface of a substrate 911 formed of n-GaN that include an n-GaN layer 921, a p-GaN layer 922, and an n-GaN layer 923 stacked in this order. Immediately below a region where a gate electrode 941 is formed, a gate trench 950 is formed by removing a part of the n-GaN layer 923, the p-GaN layer 922, and the n-GaN layer 921 by dry etching. The gate electrode 941 is formed on the sidewall and bottom of the inside of the gate trench 950 formed as above, having an insulation layer 931 layered in-between as a gate insulation film. Note that a source electrode 942 is formed contacting the n-GaN layer 923 and a drain electrode 943 is formed on the back of the substrate 911. Therefore, a current flows in a direction perpendicular to the substrate 911 when the transistor having the UMOS structure operates.

In the HEMT having the above structure, when forming the gate trench 950 by dry etching, the underlying layer is removed more at terminal parts 950a of the bottom of the gate trench 950 than at other parts of the bottom such as a center part 950b. Namely, the terminal parts 950a of the bottom of the gate trench 950 are formed deeper than the other parts of the bottom such as the center part 850b. This phenomenon is an inherent problem that arises when forming an opening by dry etching in a nitride semiconductor, which is similar to the case of a gate recess described above. If a voltage is applied to the device in which the terminal parts 950a of the bottom of the gate trench 950 is formed deeper than the center part 950b of the bottom, an electric field is concentrated in the terminal parts 950a of the bottom of the gate trench 950. This causes destruction in the terminal parts 950a of the bottom of the gate trench 950, which reduces reliability.

SUMMARY

According to at least an embodiment of the present invention, a semiconductor device includes a first semiconductor layer formed of a nitride semiconductor on a substrate; a second semiconductor layer formed of a nitride semiconductor on the first semiconductor layer; a gate trench formed in the second semiconductor layer or in the second and first semiconductor layers; a gate electrode formed at the gate trench; and a source electrode and a drain electrode formed on the second semiconductor layer. The gate trench has terminal parts of a bottom of the gate trench formed shallower than a center part of the bottom. A part of a sidewall of the gate trench is formed of a surface including an a-plane. The center part of the bottom is a c-plane. The terminal parts of the bottom form a slope from the c-plane to the c-plane.

The object and advantages of the embodiment will be realized and attained by means of the elements and combinations particularly pointed out in the claims. It is to be understood that both the foregoing general description and the following detailed description are exemplary and explanatory and are not restrictive of the invention as claimed.

BRIEF DESCRIPTION OF DRAWINGS

FIGS. 7A-7C are third process views illustrating the manufacturing method of the semiconductor device according to the first embodiment;

FIGS. 8A-8C are fourth process views illustrating the manufacturing method of the semiconductor device according to the first embodiment;

FIGS. 18A-18C are third process views illustrating the manufacturing method of the semiconductor device according to the second embodiment;

FIGS. 19A-19C are fourth process views illustrating the manufacturing method of the semiconductor device according to the second embodiment;

DESCRIPTION OF EMBODIMENTS

In the following, embodiments of the present invention will be described with reference to the drawings. Note that the same members and the like are assigned with the same numerical codes throughout the drawings, and their description is omitted accordingly.

First Embodiment (Semiconductor Device)

Figure 1:
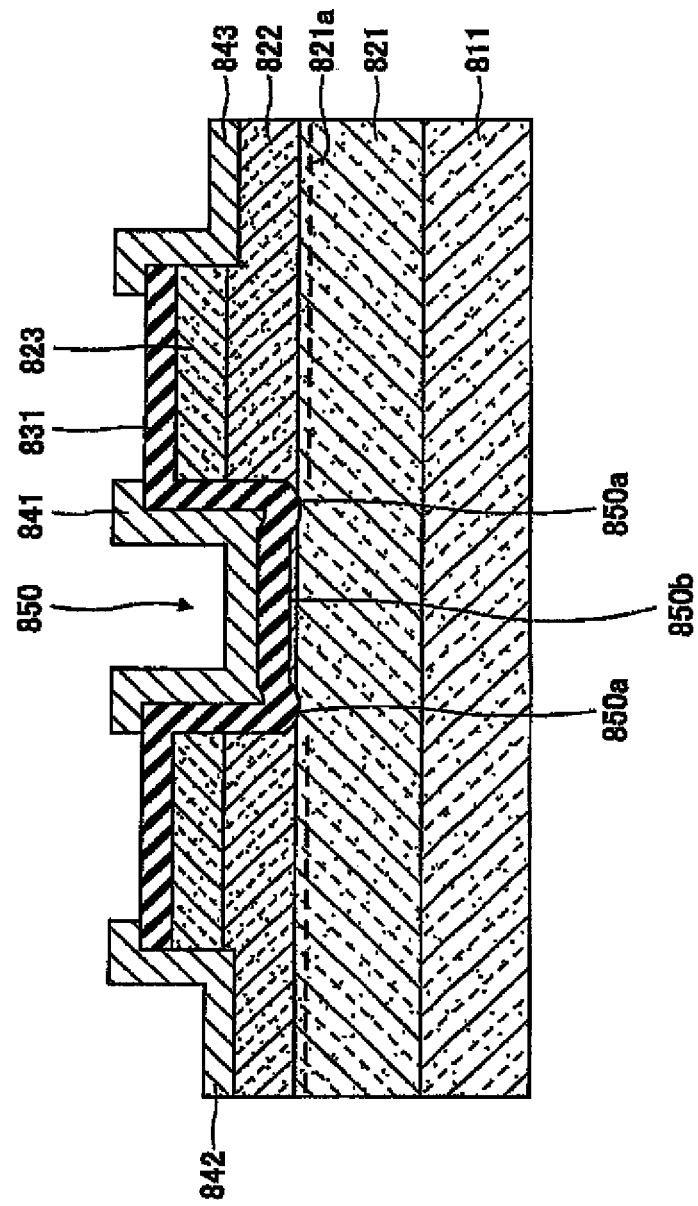
FIG. 1 is a schematic view illustrating a HEMT in which a gate recess is formed.
Figure 2:
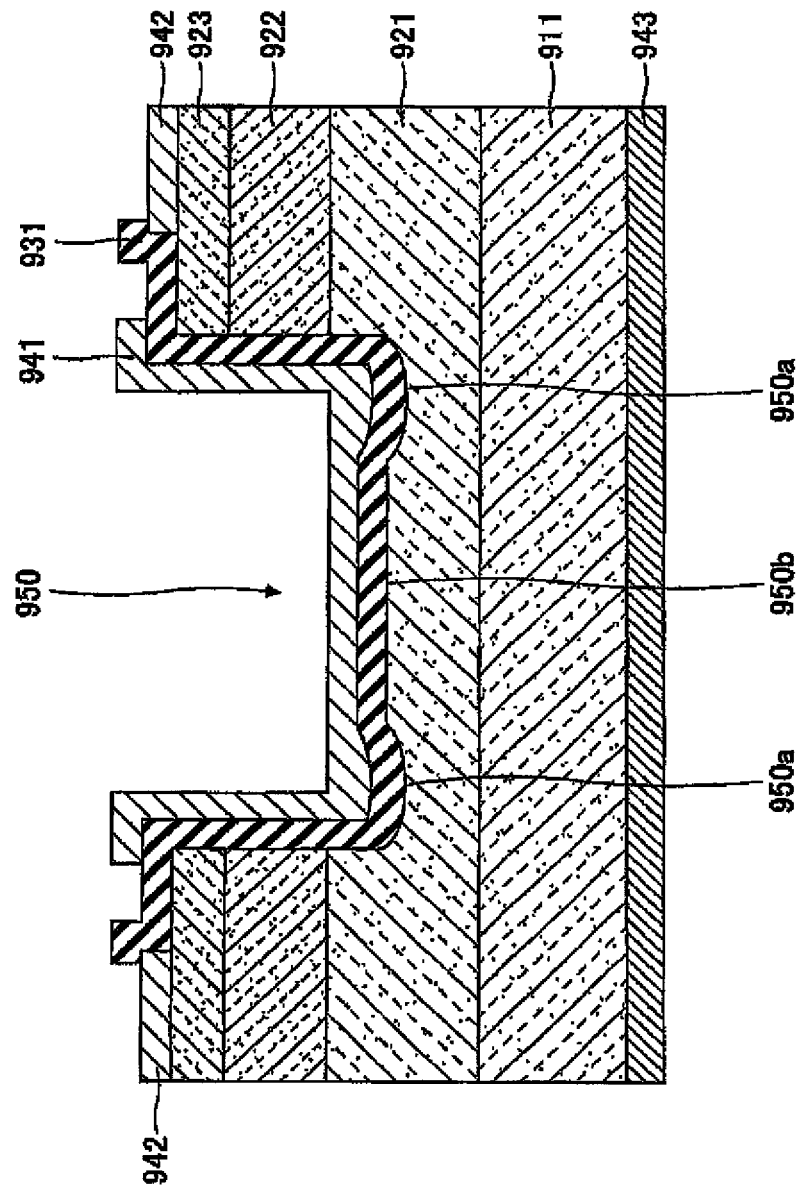
FIG. 2 is a schematic view illustrating a transistor having a UMOS structure.
Figure 3:
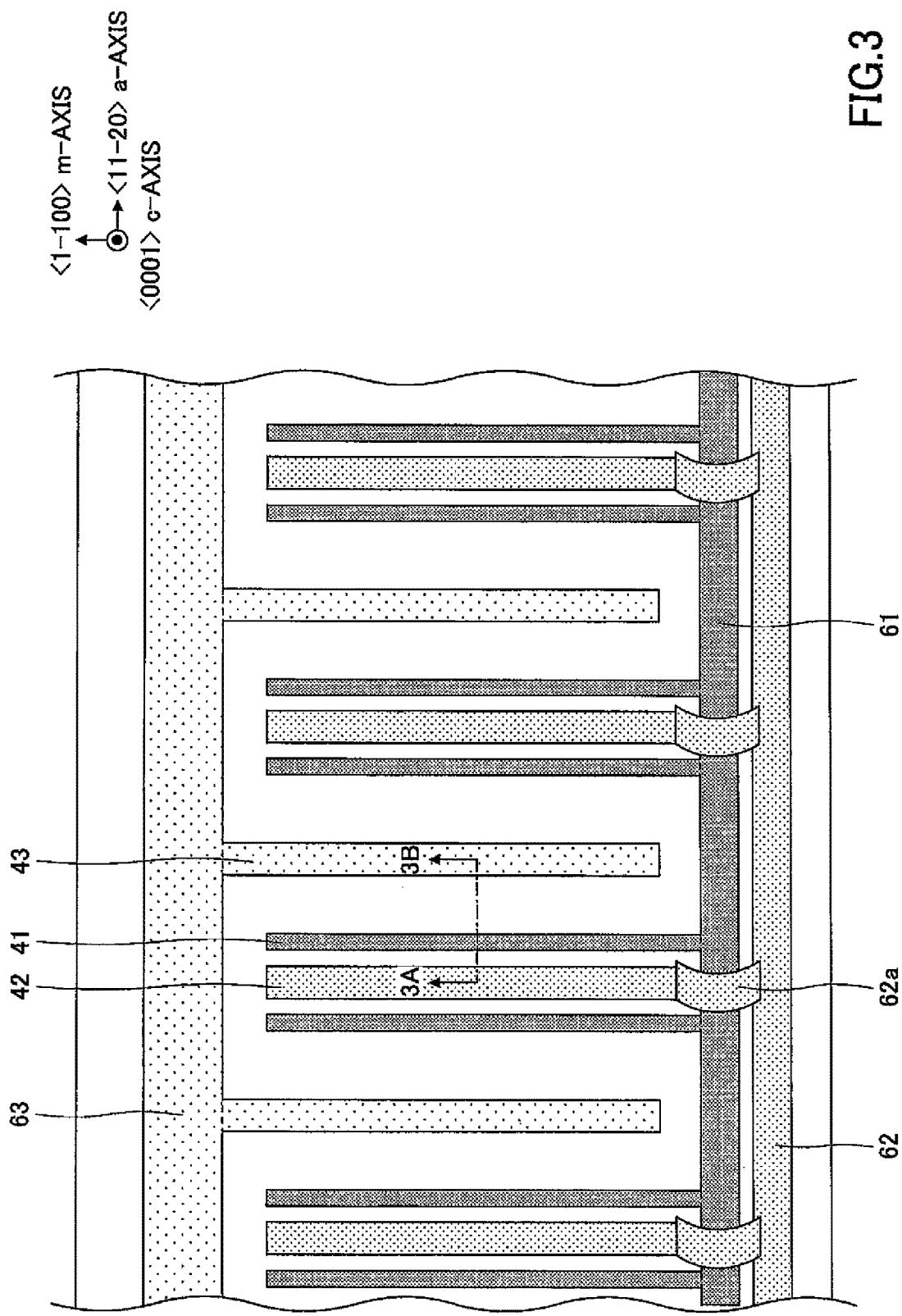
FIG. 3 is a top view of a semiconductor device according to a first embodiment.
Figure 4:
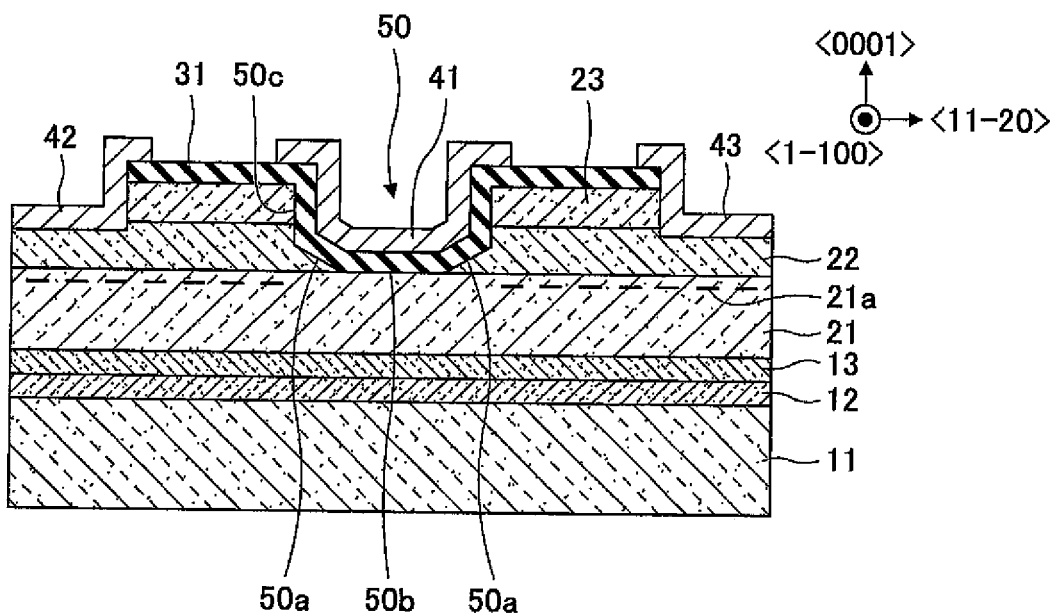
FIG. 4 is a schematic view illustrating a structure of the semiconductor device according to the first embodiment.

A HEMT will be described based on FIGS. 3-4, which is a semiconductor device in the first embodiment. Note that FIG. 3 is a top view of the semiconductor device according to the present embodiment, and FIG. 4 is a cross-sectional view of the semiconductor device taken along the dashed-dotted line 3A-3B of FIG. 3. Although description in the present embodiment assumes that multiple HEMTs are formed on the same substrate, just one HEMT may be formed.

The semiconductor device in the present embodiment has layers formed on a substrate 11 that includes an initial growth layer 12, a buffer layer 13, an electron transit layer 21, an electron supply layer 22, and a cap layer 23, which are stacked in this order and made of nitride semiconductors. Also, a gate trench 50 is formed by removing a part of the cap layer 23 and the electron supply layer 22 by dry etching in a region where a gate electrode 41 is to be formed. The gate electrode 41 is formed on the sidewall and bottom of the inside of the gate trench 50 formed as above, having an insulation layer 31 layered in-between as a gate insulation film. Namely, the insulation layer 31 is formed on the sidewall and bottom of the inside of the gate trench 50, and the gate electrode 41 is formed on the insulation layer 31. Note that a source electrode 42 and a drain electrode 43 are formed contacting the electron supply layer 22. Also, if multiple HEMTs are formed as illustrated in FIG. 3, the gate electrode 41 of each of the HEMTs is connected with a gate bus line 61. Also, the source electrode 42 is connected with a source bus line 62 via a bridge part 62a, and the drain electrode 43 is connected with a drain bus line 63.

In the semiconductor device in the present embodiment, the electron supply layer 22 has less thickness immediately below the gate electrode 41 because the gate trench 50 is formed. Therefore, although 2 DEG 21a is generated in the neighborhood of an interface between the electron transit layer 21 and the electron supply layer 22 in the electron transit layer 21, the 2 DEG 21a disappears immediately below the gate electrode 41 because the electron supply layer 22 has less thickness there. This enables the semiconductor device to take a state of normally-off in the present embodiment.

Also, in the semiconductor device in the present embodiment, the gate trench 50 has its terminal parts 50a of the bottom formed shallower than other parts of the bottom, for example, a center part 50b of the bottom. This prevents an electric field from concentrating in the terminal part 50a of the bottom of the gate trench 50, which improves voltage resistance and raises reliability of the semiconductor device. Note that, formed in this way, the center part 50b of the bottom of the gate trench 50 is a c-plane (0001), and the sidewall 50c of the gate trench 50 is an a-plane (11-20).

Note that described above is a HEMT that has a MIS (metal insulator semiconductor) structure where GaN is used for the electron transit layer 21 and AlGaN is used for the electron supply layer 22. Alternatively, the semiconductor device in the present embodiment may be a HEMT in which GaN is used for the electron transit layer 21 and InAlN is used for the electron supply layer 22, or may be a Schottky-type HEMT in which an insulation layer 31 is not formed. Also note that n-type may be referred to as a first conductivity-type, and p-type may be referred to as a second conductivity-type in the embodiments of the present invention.

(Manufacturing Method of Semiconductor Device)

Next, a manufacturing method of the semiconductor device in the first embodiment will be described based on FIGS. 5A-8C.

Figure 5A:
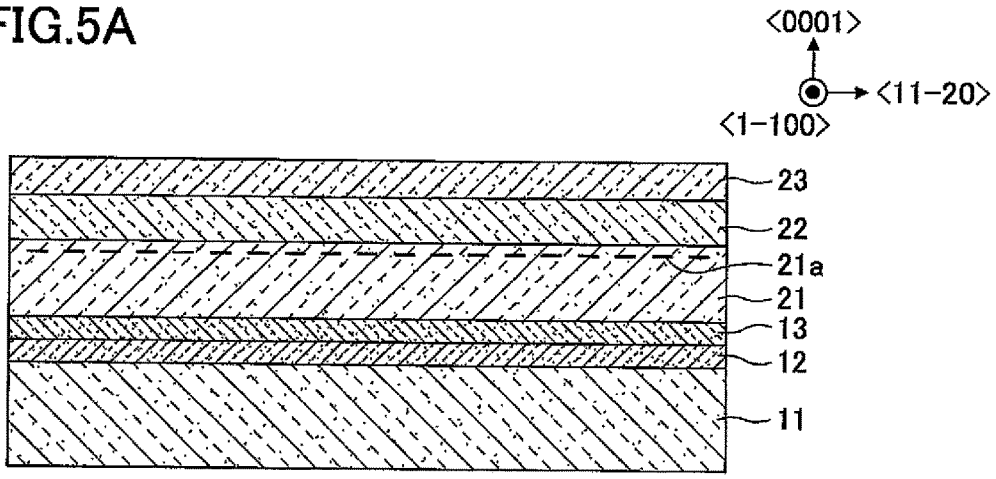
FIGS. 5A-5C are first process views illustrating a manufacturing method of the semiconductor device according to the first embodiment.

First, as illustrated in FIG. 5A, nitride semiconductor layers are formed on the substrate 11 that include the initial growth layer 12, the buffer layer 13, the electron transit layer 21, the electron supply layer 22, and the cap layer 23 by epitaxial growth. This generates the 2 DEG 21 in the neighborhood of the interface between the electron transit layer 21 and the electron supply layer 22 in the electron transit layer 21. When forming a nitride semiconductor layer by epitaxial growth, an MOCVD (Metal Organic Chemical Vapor Deposition) method is used. Note that the surface of the nitride semiconductor layers formed in this way is a c-plane (0001) in the present embodiment. Also, these nitride semiconductor layers may be formed by an MBE (Molecular Beam Epitaxy) method instead of MOCVD.

A sapphire substrate, an Si substrate, or an SiC substrate can be used for the substrate 11, for example. In the present embodiment, an Si substrate is used for the substrate 11. The initial growth layer 12 is formed of AlN having the film thickness of about 100 nm, and the buffer layer 13 is formed of AlGaN having the film thickness of about 100 nm.

The electron transit layer 21 is formed of i-GaN having the film thickness of about 1 μm.

The electron supply layer 22 is formed of AlGaN having the film thickness of about 30 nm so that when represented as $Al_xGa_{1-x}N$, X takes a value of 0.1 to 0.3. The electron supply layer 22 may be i-AlGaN or n-AlGaN. In the present embodiment, the electron supply layer 22 is formed of n-AlGaN.

The cap layer 23 is formed of n-GaN having the film thickness of about 5 nm.

When forming films of these nitride semiconductor layers by MOCVD, TMA (trimethyl aluminum) is used as a raw material gas of Al, TMG (trimethyl gallium) is used as a raw material gas of Ga, and $NH_3$ (ammonia) is used as a raw material gas of N. Note that these raw material gases are supplied to a reactor of an MOVPE device using hydrogen ($H_2$) as a carrier gas. Also, the amount of flow of ammonia gas is 100 to 10000 sccm when supplied to the reactor for forming these nitride semiconductor layers, and growth pressure to form the nitride semiconductor layers, namely, the pressure in the reactor is 50 Torr to 300 Torr.

Specifically, the initial growth layer 12 is formed by growing AlN using a mixed gas of TMA and $NH_3$ as a raw material gas under a condition of the substrate temperature at 1000° C. to 1300° C.

The buffer layer 13 is formed by growing AlGaN using a mixed gas of TMG, TMA, and $NH_3$ as a raw material gas under a condition of the substrate temperature at 900° C. to 1300° C. Note that AlGaN can be grown at a desired composition ratio by adjusting a flow ratio of TMG and TMA supplied to the reactor.

The electron transit layer 21 is formed by growing GaN using a mixed gas of TMG and $NH_3$ as a raw material gas under a condition of the substrate temperature at 900° C. to 1100° C.

The electron supply layer 22 is formed by growing n-AlGaN using a mixed gas of TMG, TMA, and $NH_3$ as a raw material gas under a condition of the substrate temperature at 900° C. to 1300° C. The electron supply layer 22 is doped with Si as an n-type impurity element so that the density of Si is $1\times10^{18}$ cm$^{-3}$ to $1\times10^{20}$ cm$^{-3}$, for example, $1\times10^{19}$ cm$^{-3}$. $SiH_4$ or the like is used as a raw material gas of Si. Note that n-AlGaN can be grown at a desired composition ratio by adjusting a flow ratio of TMG and TMA supplied to the reactor.

The cap layer 23 is formed by growing n-GaN using a mixed gas of TMA and $NH_3$ as a raw material gas under a condition of the substrate temperature at 900° C. to 1100° C. The cap layer 23 is doped with Si as an n-type impurity element so that the density of Si is $1\times10^{18}$ cm$^{-3}$ to $1\times10^{20}$ cm$^{-3}$, for example, $1\times10^{19}$ cm$^{-3}$. $SiH_4$ or the like is used as a raw material gas of Si.

Figure 5B:
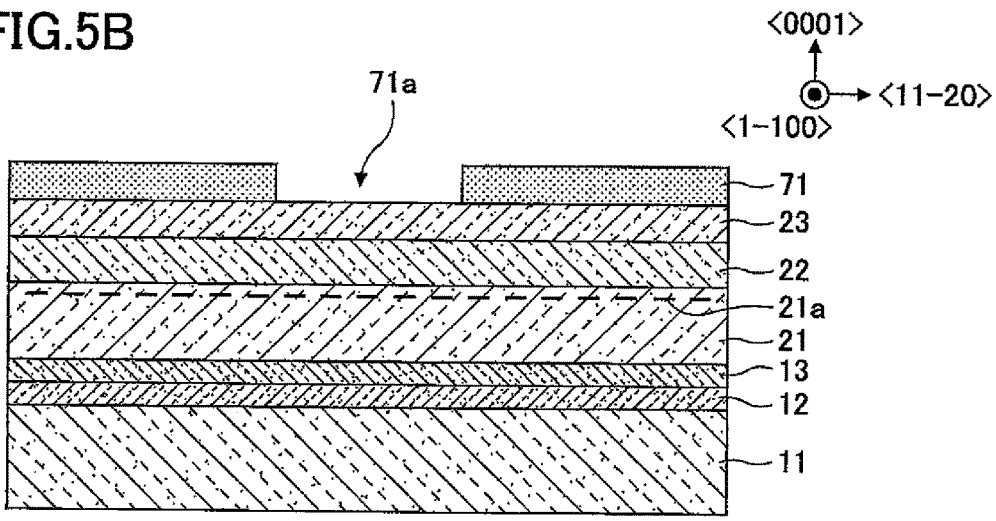

Next, as illustrated in FIG. 5B, a hard mask 71 is formed on the cap layer 23. Specifically, a $Si_3N_4$ film is formed on the cap layer 23 by CVD (Chemical Vapor Deposition) to have the thickness of about 200 nm. After that, photoresist is applied on the $Si_3N_4$ film, which is then exposed by an exposure device and developed so that a photoresist pattern (not illustrated) is formed. After that, the $Si_3N_4$ film is removed in a region where the photoresist pattern is not formed, by dry etching such as RIE (Reactive Ion Etching) or the like that uses a fluorine-based gas as an etching gas. Thus, the hard mask 71 is formed on the cap layer 23. After that, the photoresist pattern (not illustrated) is removed by an organic solvent or the like. Note that described above is a case where the $Si_3N_4$ film is removed by dry etching. Alternatively, the $Si_3N_4$ film may be removed by wet etching using a buffered hydrofluoric acid or the like as an etching liquid. Also, the material that forms the hard mask 71 may be $SiO_2$ formed by CVD, sputtering, SOG, and the like. The hard mask 71 formed in this way includes a finger-shaped opening 71a along the m-axis <1-100> of GaN in the electron transit layer 21.

Figure 5C:
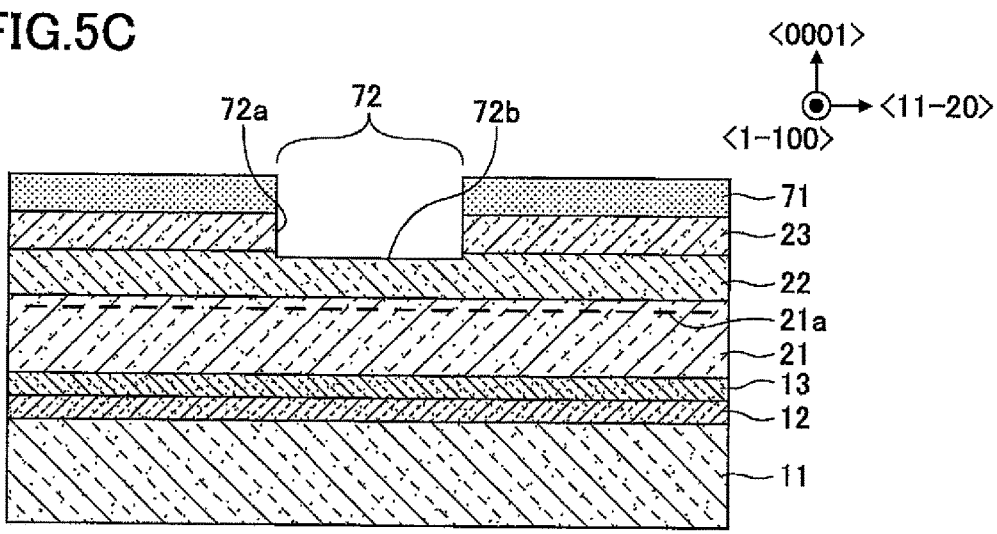

Next, as illustrated in FIG. 5C, a first opening 72 is formed by removing a part of the cap layer 23 and the electron supply layer 22 by dry etching such as RIE or the like using the hard mask 71 as a mask. A chlorine-based gas is used as an etching gas for this dry etching. At this moment, etching is performed so that the sidewall 72a of the opening 72 is virtually vertical to the substrate 11 to make the sidewall 72a of the first opening 72 be an a-plane (11-20) or a surface close to the a-plane (11-20). Note that described above is a case where the electron supply layer 22 is at the bottom 72b of the first opening 72. Alternatively, the first opening 72 may be formed so that the cap layer 23 is at the bottom 72b of the first opening 72, or the electron supply layer 22 may be completely removed at the bottom 72b of the first opening 72 to have the electron transit layer 21 exposed.

Figure 6A:
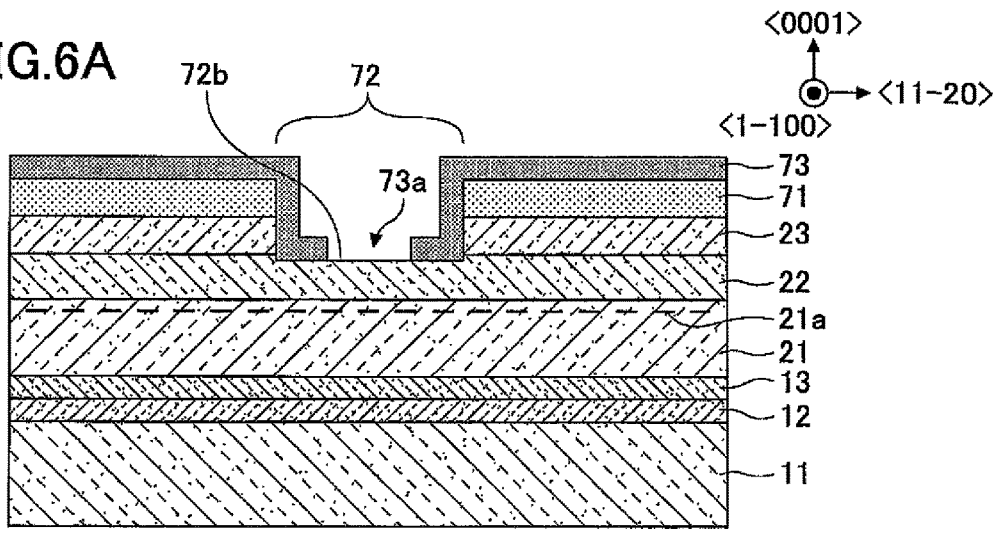
FIGS. 6A-6C are second process views illustrating the manufacturing method of the semiconductor device according to the first embodiment.

Next, as illustrated in FIG. 6A, the photoresist pattern 73 is formed on the hard mask 71, the electron supply layer 22 exposed at the bottom 72b of the first opening 72, and the like. This photoresist pattern 73 has the opening 73a formed at the center part of the bottom 72b of the first opening 72. Specifically, the photoresist pattern 73 is formed by applying photoresist on the hard mask 71, the electron supply layer 22 exposed at the bottom 72b of the first opening 72, and the like, which is then exposed by an exposure device, and developed.

Figure 6B:
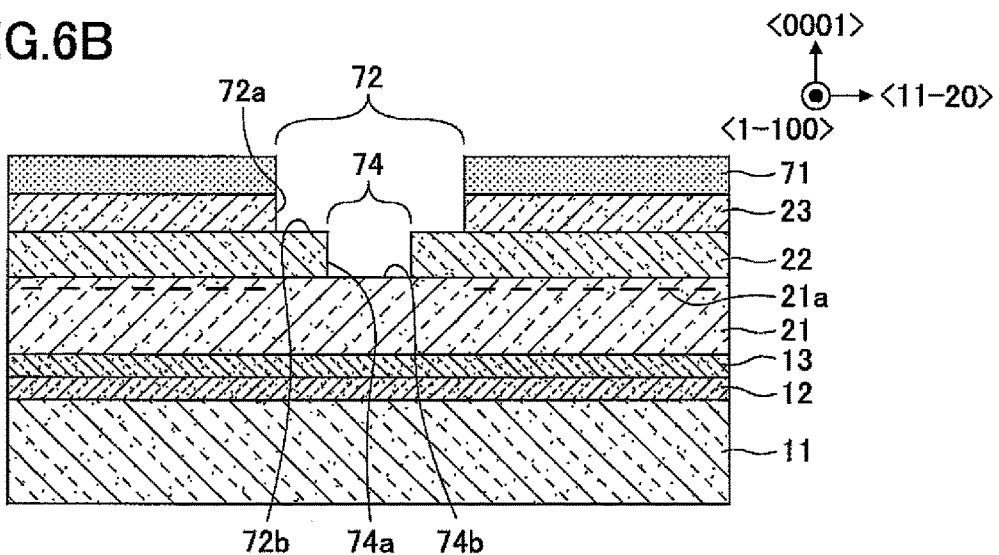

Next, as illustrated in FIG. 6B, the second opening 74 is formed by removing a part of the electron supply layer 22 at the opening 73a of the photoresist pattern 73 by dry etching such as RIE or the like using a chlorine-based gas as an etching gas. At this moment, the second opening 74 is formed by dry etching such as RIE or the like using a chlorine-based gas as an etching gas so that the bottom 74b of the second opening 74 is positioned several nm deeper than the bottom 72b of the first opening 72. Thus, the sidewall 74a of the second opening 74 is formed between the bottom 72b of the first opening 72 and the bottom 74b of the second opening 74. After that, the photoresist pattern 73 is removed by an organic solvent or the like.

Figure 6C:
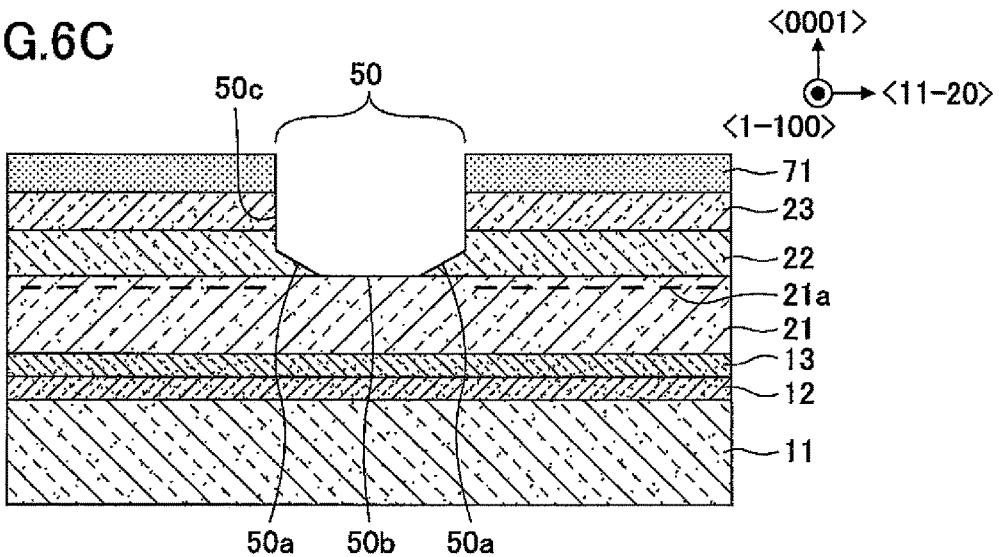

Next, as illustrated in FIG. 6C, a part of the electron supply layer 22 at the bottom 72b of the first opening 72 is removed by wet etching. A high-temperature KOH solvent or a TMAH (tetramethylammonium hydroxide) solvent is used as an etching liquid for this wet etching, which is, for example, a KOH solvent having the temperature at 75° C. and the concentration of 2 mol/L, or a TMAH solvent having the temperature at 75° C. and the concentration of 25%. Note that an alkaline etching liquid other than a KOH solvent or a TMAH solvent may be used as an etching liquid for this wet etching. Thus, the gate trench 50 is formed by processing the first opening 72 and the second opening 74. This gate trench 50 has the terminal parts 50a at the bottom that are formed as slopes having angles of 10° to 30° relative to the substrate 11, and the terminal parts 50a at the bottom are formed at a position shallower than the center part 50b of the bottom. Also, the bottom 74b of the second opening 74 is hardly removed by wet etching, because it is a c-plane (0001). Therefore, the bottom 74b of the second opening 74 is the center part 50b of the bottom of the gate trench 50.

Figure 9A:
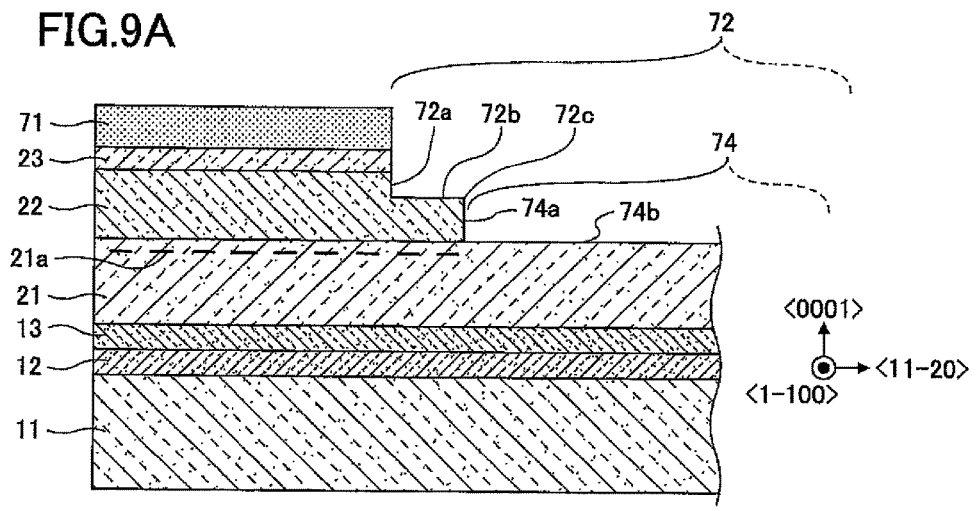
FIGS. 9A-9C are schematic views illustrating a forming method of a gate recess according to the first embodiment.
Figure 9B:
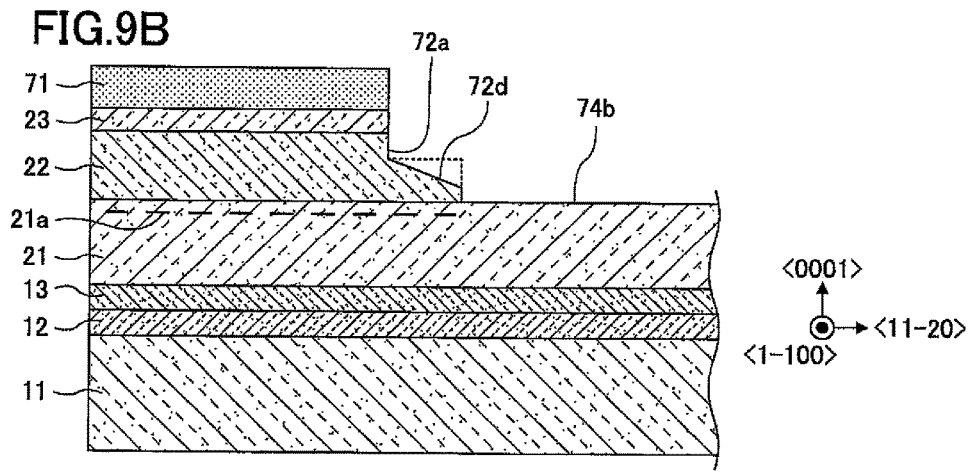

This wet etching process will be described in detail based on FIGS. 9A-9C. FIG. 9A is an enlarged view of a core part in a state illustrated in FIG. 6B. In this state, the second opening 74 is formed at the bottom 72b of the first opening 72 as described above. Also, the hard mask 71 is formed on the cap layer 23 except for a region where the first opening 72 and the second opening 74 are formed. The bottom 74b of the second opening 74 is formed at a deeper position than the bottom 72b of the first opening 72, and a stage part is formed between the bottom 74b of the second opening 74 and the bottom 72b of the first opening 72. In the present embodiment, the edge on the side of the second opening 74 in the bottom 72b of the first opening 72 will be referred to as the corner part 72c of the bottom 72b of the first opening 72. Note that, in this state, the sidewall 72a of the first opening 72 and the sidewall 74a of the second opening 74 are an a-plane (11-20) or a surface close to the a-plane (11-20). Also, the bottom 72b of the first opening 72 and the bottom 74b of the second opening 74 are a c-plane (0001) or a surface close to the c-plane (0001).

By performing wet etching using a high-temperature KOH solvent or a TMAH solvent from the state illustrated in FIG. 9A, etching proceeds gradually, starting from the corner part 72c of the bottom 72b of the first opening 72. Thus, as illustrated in FIG. 9B, a slope 72d is formed that has an angle of 10° to 30° relative to the substrate 11. At this moment, the sidewall 72a of the first opening 72 is hardly etched because the hard mask 71 is formed above.

Figure 9C:
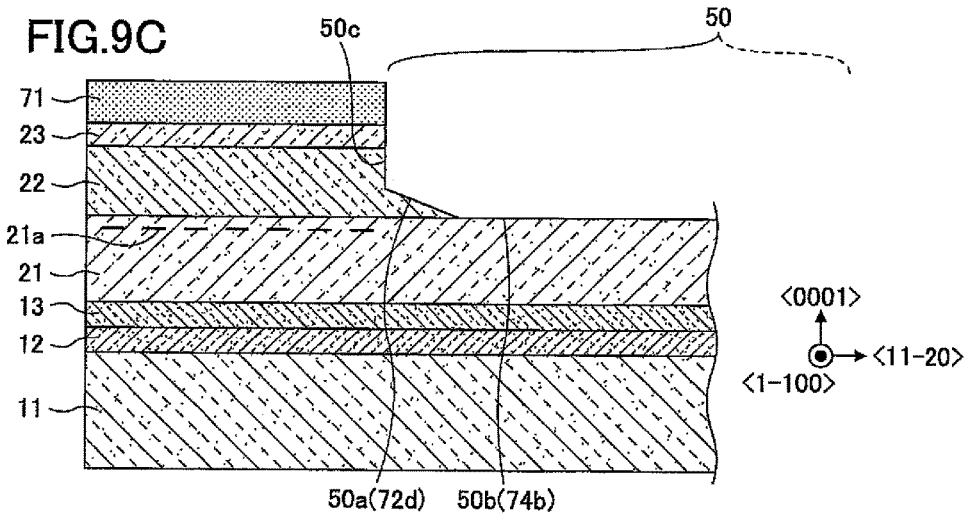
Figure 10:
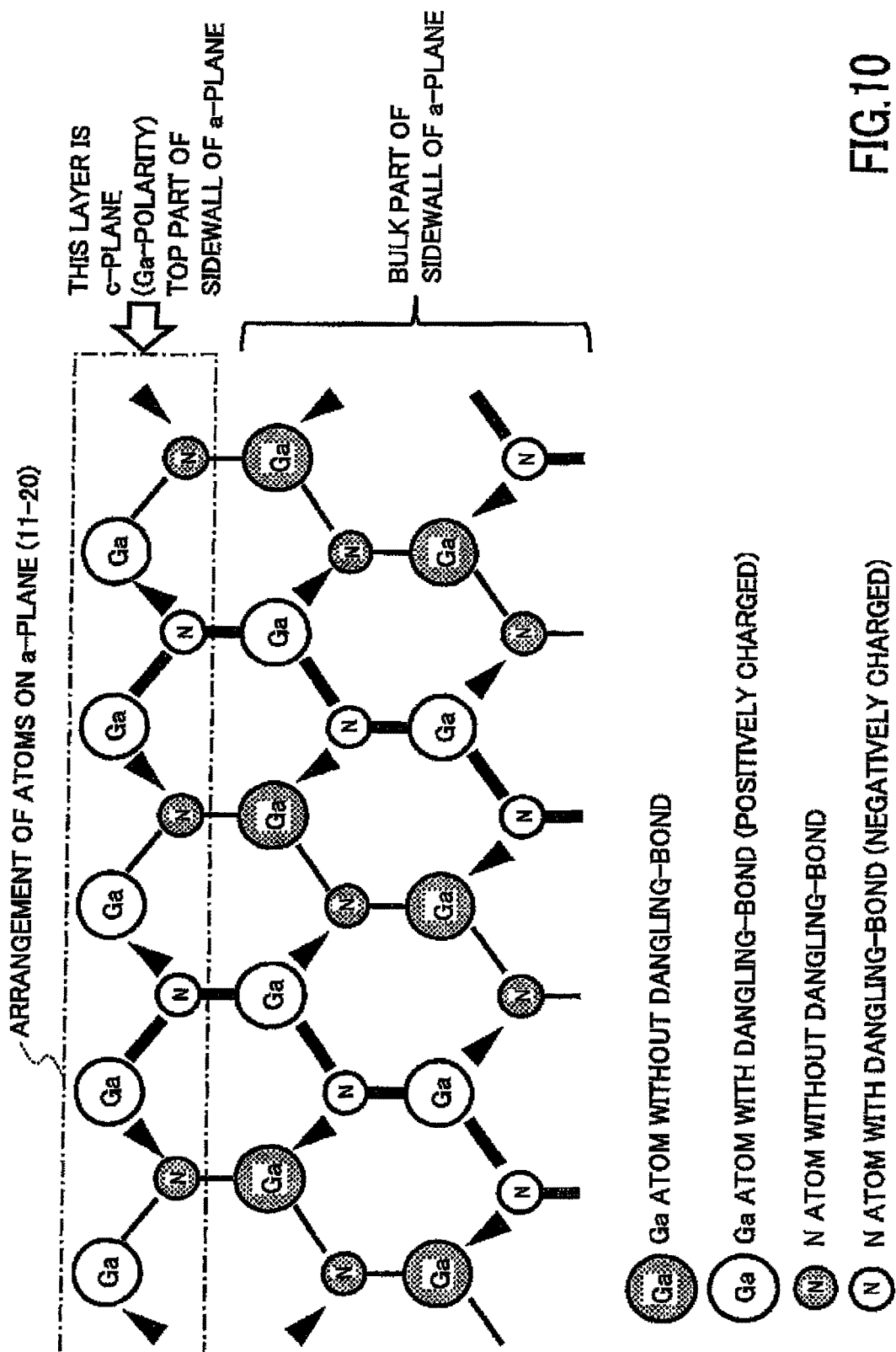
FIG. 10 is a schematic view illustrating wet etching for a GaN material.

After that, by further performing wet etching, as illustrated in FIG. 9C, etching that has started from the corner part 72c of the bottom 72b of the first opening 72 proceeds further, which makes the slope 72d contact with the bottom 74b of the second opening 74. Thus, the gate trench 50 is formed. In this gate trench 50, the terminal parts 50a are formed with the slopes 72d at the bottom, and the center part 50b of bottom is formed with the bottom 74b of the second opening 74. Namely, the bottom 72b of the first opening 72 is a c-plane (0001) or a surface close to a the c-plane (0001), and the sidewall of the second opening 74 is an a-plane (11-20) or a surface close to the a-plane (11-20). Therefore, Ga at the corner part 72c at the bottom 72b of the first opening 72 has a dangling bond as illustrated in FIG. 10, and Ga having such a dangling bond tends to be removed, which makes the etching proceed from such a part.

Figure 11:
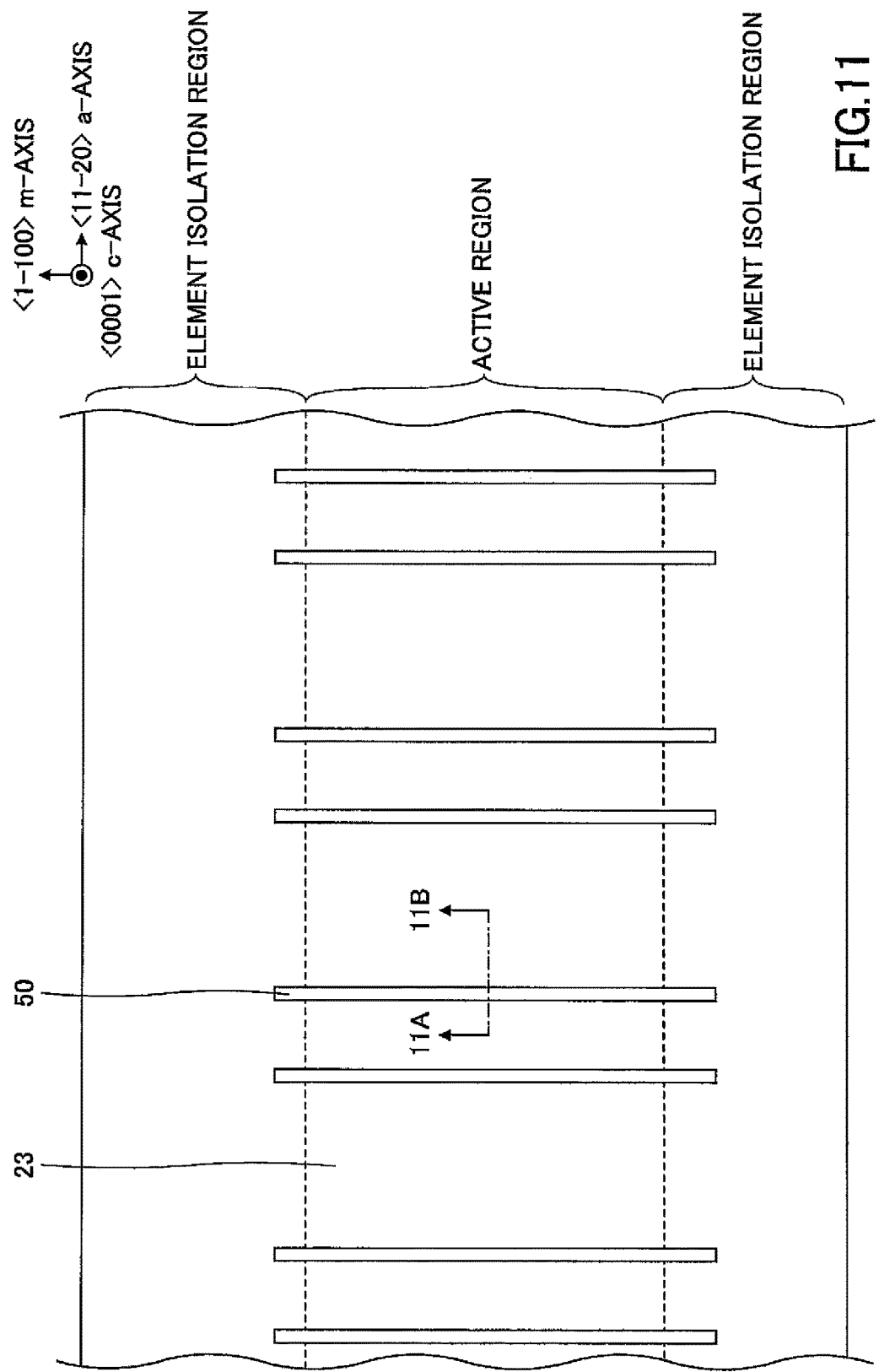
FIG. 11 is a first top view of a manufacturing process of the semiconductor device according to the first embodiment.

Next, the hard mask 71 is removed by wet etching as illustrated in FIG. 7A. For this wet etching, a hydrofluoric acid or the like is used as an etching liquid. Note that FIG. 11 is a top view in this state, and FIG. 7A is a cross-sectional view taken along the dashed-dotted line 11A-11B of FIG. 11.

Next, as illustrated in FIG. 7B, the cap layer 23 is removed in regions where the source electrode 42 and the drain electrode 43 are to be formed to have the electron supply layer 22 exposed. At this moment, a part of the electron supply layer 22 may be removed. Specifically, by applying photoresist on the cap layer 23, which is then exposed by an exposure device and developed, a photoresist pattern (not illustrated) is formed that has openings in the regions where the source electrode 42 and the drain electrode 43 are to be formed. After that, the cap layer 23 is removed in the regions where the photoresist pattern is not formed by dry etching such as RIE or the like, to have the electron supply layer 22 exposed. Note that the photoresist pattern (not illustrated) is removed by an organic solvent or the like.

Next, as illustrated in FIG. 7C, an insulation film 31t is formed on the electron supply layer 22 and the like in a region where the gate trench 50 is formed and on the cap layer 23. Specifically, the insulation film 31t is formed by forming a film of $Al_2O_3$ to have the thickness of about 50 nm by ALD (Atomic Layer Deposition). The insulation film 31t may be formed of materials other than $Al_2O_3$ as long as it is an oxide or a nitride, for example, one or more materials selected among $SiO_2$, $HfO_2$, $Ga_2O_3$, $Si_3N_4$, and the like. Further, these materials may be stacked to form the film.

Next, as illustrated in FIG. 8A, the insulation film 31t is removed in the regions where the source electrode 42 and the drain electrode 43 are to be formed to have the electron supply layer 22 exposed. Thus, by removing the insulation film 31t in the regions where the source electrode 42 and the drain electrode 43 are to be formed, the insulation layer 31 is formed with the remaining insulation film 31t. Specifically, by applying photoresist on the insulation film 31t, which is then exposed by an exposure device and developed, a photoresist pattern (not illustrated) is formed that has an opening in the regions where the source electrode 42 and the drain electrode 43 are to be formed. After that, the insulation film 31t is removed in the regions where the photoresist pattern is not formed, by dry etching or wet etching, to form the insulation layer 31 as a gate insulation film. Note that the insulation film 31t may be removed by ion milling or the like if the insulation film 31t is formed of $Al_2O_3$. Also, the photoresist pattern (not illustrated) is removed by an organic solvent or the like.

Figure 12:
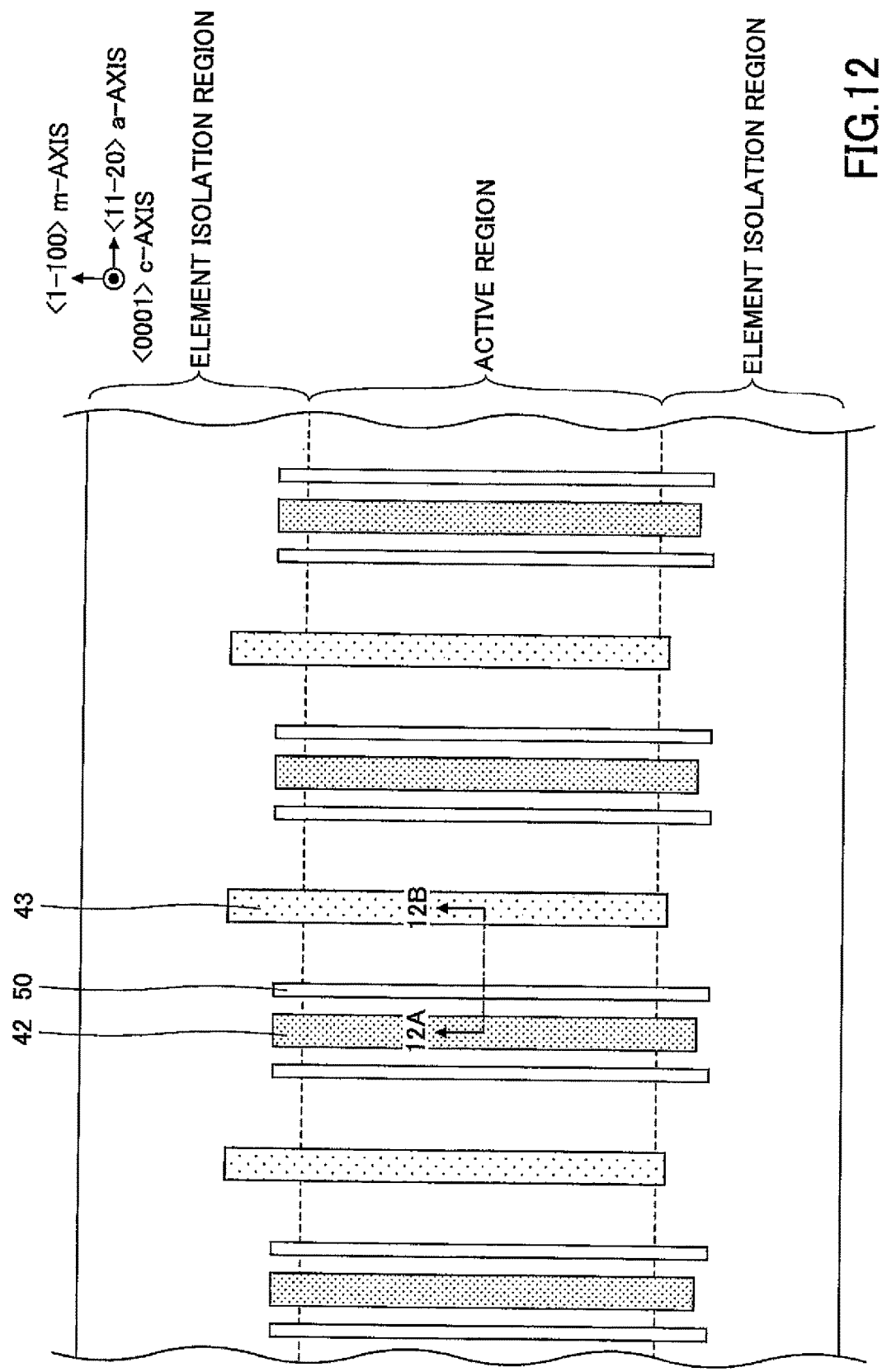
FIG. 12 is a second top view of the manufacturing process of the semiconductor device according to the first embodiment.

Next, as illustrated in FIG. 8B, the source electrode 42 and the drain electrode 43 are formed. Specifically, by applying photoresist on the surface of the insulation layer 31 and the electron supply layer 22, which is then exposed by an exposure device and developed, a photoresist pattern (not illustrated) is formed that has an opening in the regions where the source electrode 42 and the drain electrode 43 are to be formed. After that, a stacked metal film made of Ti/Al is formed on the surface where the photoresist pattern is formed by vacuum deposition. In the stacked metal film, a Ti film having the thickness of about 10 nm and an Al film having the thickness of about 300 nm are stacked. After that, by dipping into an organic solvent or the like, the stacked metal film formed on the photoresist pattern is removed by liftoff, along with the photoresist pattern. Thus, the source electrode 42 and the drain electrode 43 are formed with the remaining stacked metal film. After that, heat treatment is applied by RTA (Rapid Thermal Annealing) or the like in a nitrogen atmosphere at a temperature of 400° C. to 1000° C., for example, at the temperature of 700° C. Thus, ohmic contact is established between the source electrode 42 and the drain electrode 43. Note that FIG. 12 is a top view in this state and FIG. 8B is a cross-sectional view taken along the dashed-dotted line 12A-12B of FIG. 12.

Figure 13:
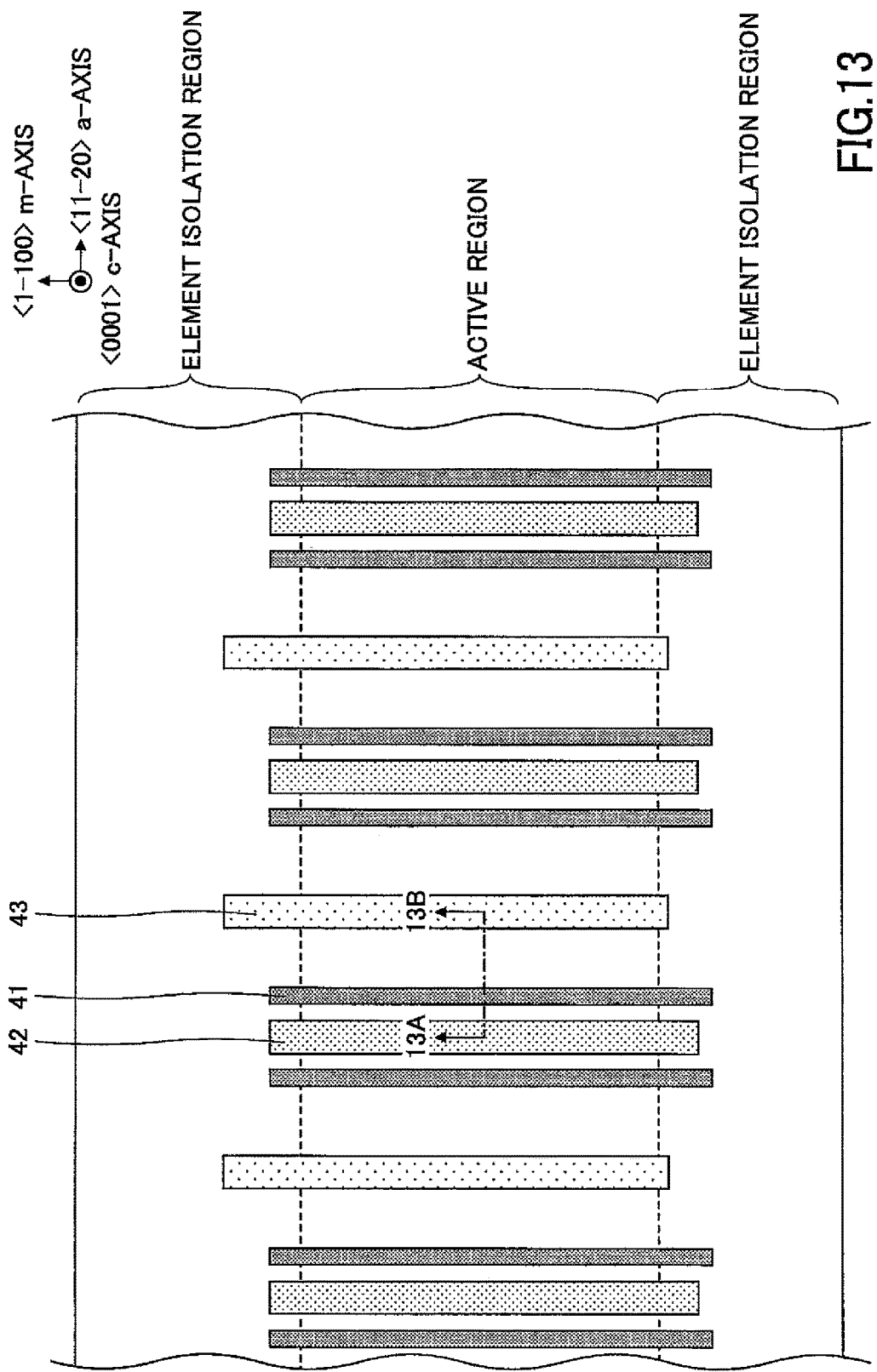
FIG. 13 is a third top view of the manufacturing process of the semiconductor device according to the first embodiment.

Next, as illustrated in FIG. 8C, the gate electrode 41 is formed. Specifically, by applying photoresist on the surface of the insulation layer 31, the source electrode 42, and the drain electrode 43, which is then exposed by an exposure device and developed, a photoresist pattern (not illustrated) is formed that has an opening in a region where the gate electrode 41 is to be formed. After that, a stacked metal film made of Ni/Au is formed on the surface where the photoresist pattern is formed by vacuum deposition. After that, by dipping into an organic solvent or the like, the stacked metal film formed on the photoresist pattern is removed by liftoff, along with the photoresist pattern. Thus, the gate the electrode 41 is formed with the remaining stacked metal film in the gate trench 50. FIG. 13 is a top view in this state and FIG. 8C is a cross-sectional view taken along the dashed-dotted line 13A-13B of FIG. 13.

After that, an interlayer insulating film (not illustrated) may be formed to form wiring and the like.

The semiconductor device in the present embodiment can be manufactured by the above process.

Second Embodiment (Semiconductor Device)

Figure 14:
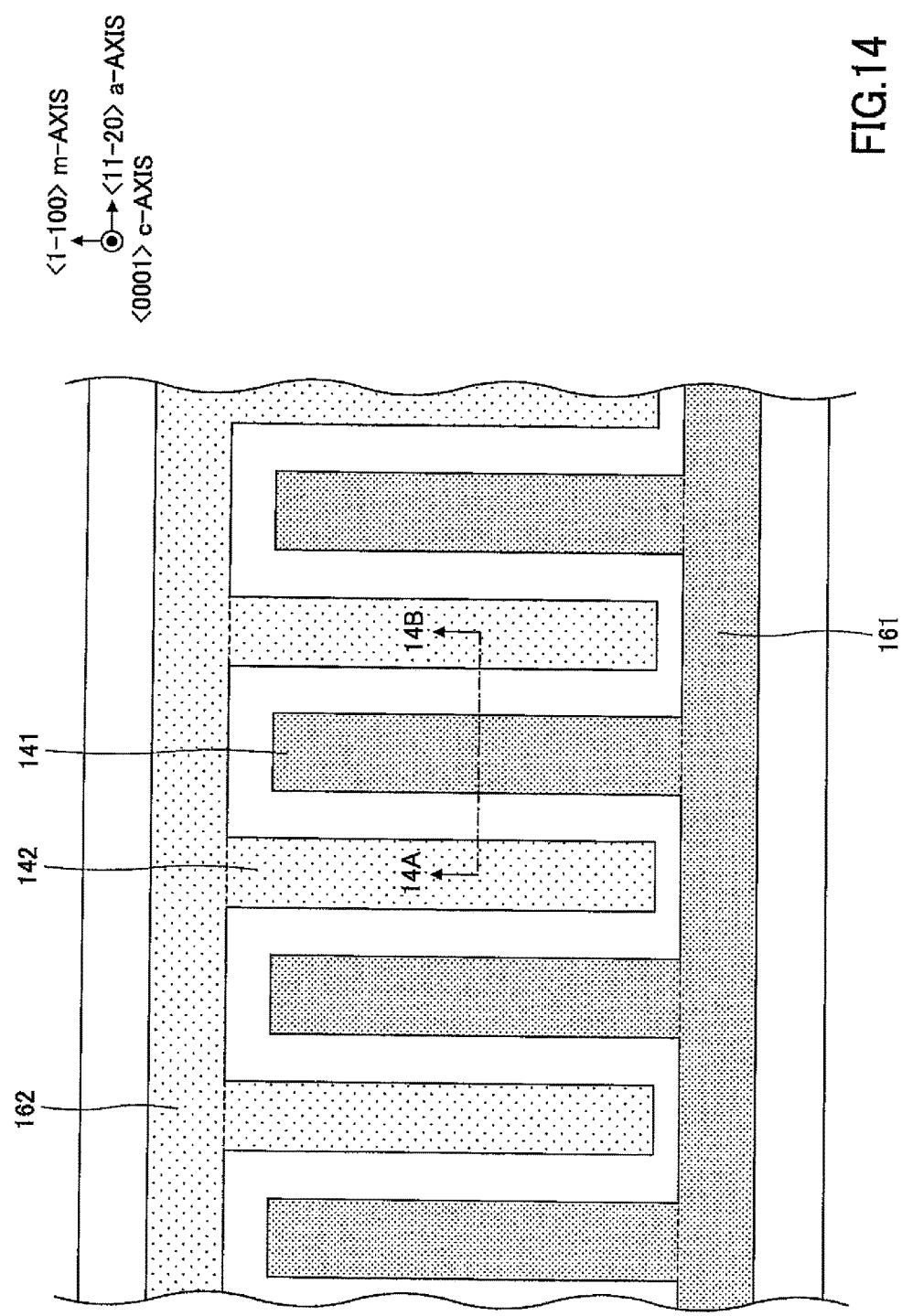
FIG. 14 is a top view of a semiconductor device according to a second embodiment.
Figure 15:
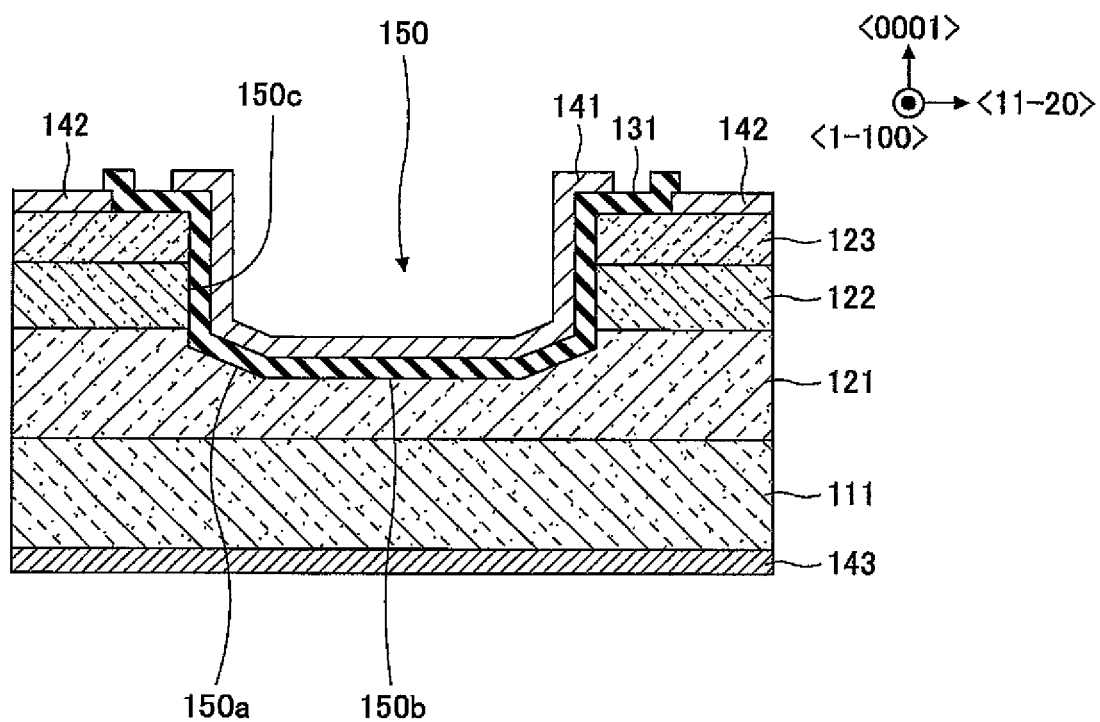
FIG. 15 is a schematic view illustrating a structure of the semiconductor device according to the second embodiment.

Next, a transistor having a UMOS structure as a semiconductor device in the second embodiment will be described based on FIGS. 14-15. Note that FIG. 14 is a top view of the semiconductor device according to the present embodiment, and FIG. 15 is a cross-sectional view of the semiconductor taken along the dashed-dotted line 14A-14B of FIG. 14. Although description in the present embodiment assumes that multiple transistors having a UMOS structure are formed on the same substrate in the present embodiment, just one transistor having a UMOS structure may be formed.

The semiconductor device in the present embodiment has layers formed on the surface of a substrate 111 that include a first semiconductor layer 121, a second semiconductor layer 122, and a third semiconductor layer 123, which are stacked in this order. Note that the substrate 111 is an n-type substrate, for example, an n-GaN substrate. The first semiconductor layer 121 is n-type and formed of, for example, n-GaN, the second semiconductor layer 122 is p-type and formed of, for example, p-GaN, and the third semiconductor layer 123 is n-type and formed of, for example, n-GaN.

Also, a gate trench 150 is formed by removing a part of the third semiconductor layer 123, the second semiconductor layer 122, and the first semiconductor layer 121 by dry etching in a region where a gate electrode 141 is formed. The gate electrode 141 is formed on the sidewall and bottom of the inside of the gate trench 150 formed as above, having an insulation layer 131 layered in-between as a gate insulation film. Namely, the insulation layer 131 is formed on the sidewall and bottom of the inside of the gate trench 150, and the gate electrode 141 is formed on the insulation layer 131. Note that source electrodes 142 are formed on the third semiconductor layer 123 and a drain electrode 143 is formed on the back of the substrate 111, namely, the opposite side surface. Also, if multiple transistors having the UMOS structure are formed as illustrated in FIG. 14, the gate electrode 141 of each of the transistors having the UMOS structure is connected with a gate bus line 161, and the source electrodes 142 of each of the transistors having the UMOS structure are connected with a source bus line 162.

Also, in the semiconductor device in the present embodiment, the gate trench 150 has its terminal parts 150a of the bottom formed shallower than other parts of the bottom, for example, a center part 150b of the bottom. This prevents an electric field from concentrating in the terminal parts 150a of the bottom of the gate trench 150, which improves voltage resistance and raises reliability of the semiconductor device. Note that, formed in this way, the center part 150b of the bottom of the gate trench 150 is a c-plane (0001), and the sidewall 150c of the gate trench 150 is an a-plane (11-20).

To describe the semiconductor device in the present embodiment in detail, a case will be considered where a bias voltage is constantly applied between the source electrodes 142 and the drain electrode 143, while having the drain electrode 143 positively biased.

In this case, in an off state where the voltage is not applied to the gate electrode 141, an electric field concentrates at the terminals part 150a of the bottom of the gate trench 150, and at a p-n junction between the first semiconductor layer 121 and the second semiconductor layer 122. Especially in a transistor having a UMOS structure, the electric field tends to concentrate at terminal parts of the bottom of the gate trench 150, which results in destruction or the like. In the semiconductor device in the present embodiment, the gate trench 150 has its terminal parts 150a of the bottom formed shallower than the center part 150b of the bottom, which prevents the electric field from concentrating, and improves the voltage resistance.

Also, in an on state where the voltage is applied to the gate electrode 141, a positive bias is applied to the gate electrode 141 relative to the source electrodes 142 as a reference. At this moment, an inversion layer is formed in the neighborhood of an interface with the insulation layer 131 in the second semiconductor layer 122 formed of p-GaN or the like, which induces conduction between the source electrodes 142 and the drain electrode 143. At this moment, in the semiconductor device in the present embodiment, the sidewall 150c of the gate trench 150 has high mobility as a current path because it is a non-polarized surface, or an a-plane (11-20), which is not much influenced by polarized electric charge of GaN. Therefore, the on resistance can be kept low. Also, if the sidewall of the gate trench 150 is formed in a tapered shape as disclosed in Patent Document 2, a gate threshold value voltage is fluctuated by polarized electric charge of GaN, and a variation is generated in the on resistance and the amount of flowing current, which reduces the yield and the like. However, in the semiconductor device in the present embodiment, the sidewall 150c of the gate trench 150 is a non-polarized surface whose influence on the gate threshold value voltage is extremely small, which improves the yield of the semiconductor device.

(Manufacturing Method of Semiconductor Device)

Next, a manufacturing method of the semiconductor device in the second embodiment will be described based on FIGS. 16A-19C.

Figure 16A:
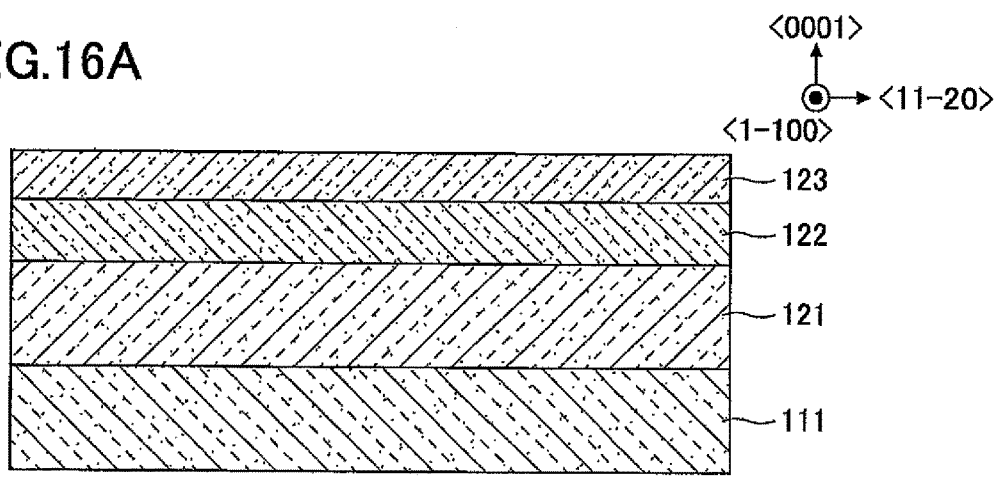
FIGS. 16A-16C are first process views illustrating a manufacturing method of the semiconductor device according to the second embodiment.

First, as illustrated in FIG. 16A, nitride semiconductor layers are formed on the surface of the substrate 111 that include the first semiconductor layer 121, the second semiconductor layer 122, and the third semiconductor layer 123 by epitaxial growth. When forming the nitride semiconductor layers by epitaxial growth, an MOCVD (Metal Organic Chemical Vapor Deposition) method is used. Note that the surface of the nitride semiconductor layers formed in this way is a c-plane (0001) in the present embodiment. Also, these nitride semiconductor layers may be formed by an MBE (Molecular Beam Epitaxy) method instead of MOCVD.

An n-GaN substrate is used for the substrate 111, which is doped with Si as an n-type impurity element so that the density of Si is about $1 \times 10^{19}$ cm$^{-3}$.

The first semiconductor layer 121 is formed of n-GaN having the film thickness of about 10 μm, the second semiconductor layer 122 is formed of p-GaN having the film thickness of about 1 μm, and the third semiconductor layer 123 is formed of n-GaN having the film thickness of about 100 nm. Thus, the first semiconductor layer 121, the second semiconductor layer 122, and the third semiconductor layer 123 are formed and stacked on the substrate 111 in this order.

When forming films of these nitride semiconductor layers by MOCVD, TMG (trimethyl gallium) is used as a raw material gas of Ga, and NH$_3$ (ammonia) is used as a raw material gas of N. Note that these raw material gases are supplied to a reactor of an MOVPE device using hydrogen (H$_2$) as a carrier gas. Also, the amount of flow of ammonia gas is 100 to 10000 sccm when being supplied to the reactor to form these nitride semiconductor layers, and growth pressure to form the nitride semiconductor layers, namely, the pressure in the reactor, is 50 Torr to 300 Torr.

Specifically, the first semiconductor layer 121 is formed by growing n-GaN using raw material gases of a mixed gas of TMG and NH$_3$ and a gas that includes an n-type impurity element under a condition of the substrate temperature at 900° C. to 1100° C. Si is used as an n-type impurity element, which is doped at the density of $1 \times 10^{15}$ cm$^{-3}$ to $1 \times 10^{18}$ cm$^{-3}$, for example, $5 \times 10^{16}$ cm$^{-3}$, using SiH$_4$ or the like as a raw material gas.

The second semiconductor layer 122 is formed by growing p-GaN using raw material gases of a mixed gas of TMG and NH$_3$ and a gas that includes a p-type impurity element under a condition of the substrate temperature at 900° C. to 1100° C. Mg is used as a p-type impurity element, which is doped at the density of $5 \times 10^{18}$ cm$^{-3}$ to $5 \times 10^{29}$ cm$^{-3}$, for example, $1 \times 10^{19}$ cm$^{-1}$, using Cp2Mg (bis-cycropentadienyl magnesium) or the like as a raw material gas. Note that, after the film of the second semiconductor layer 122 is formed, heat treatment is applied in an N$_2$ atmosphere at a temperature of 400° C. to 1000° C. to activate it as p-type.

The third semiconductor layer 123 is formed by growing n-GaN using raw material gases of a mixed gas of TMG and NH$_3$ and a gas that includes an n-type impurity element under a condition of the substrate temperature at 900° C. to 1100° C. Si is used as an n-type impurity element, which is doped at the density of $1 \times 10^{15}$ cm$^{-3}$ to $1 \times 10^{18}$ cm$^{-3}$, for example, $5 \times 10^{16}$ cm$^{-3}$, using SiH$_4$ or the like as a raw material gas.

Figure 16B:
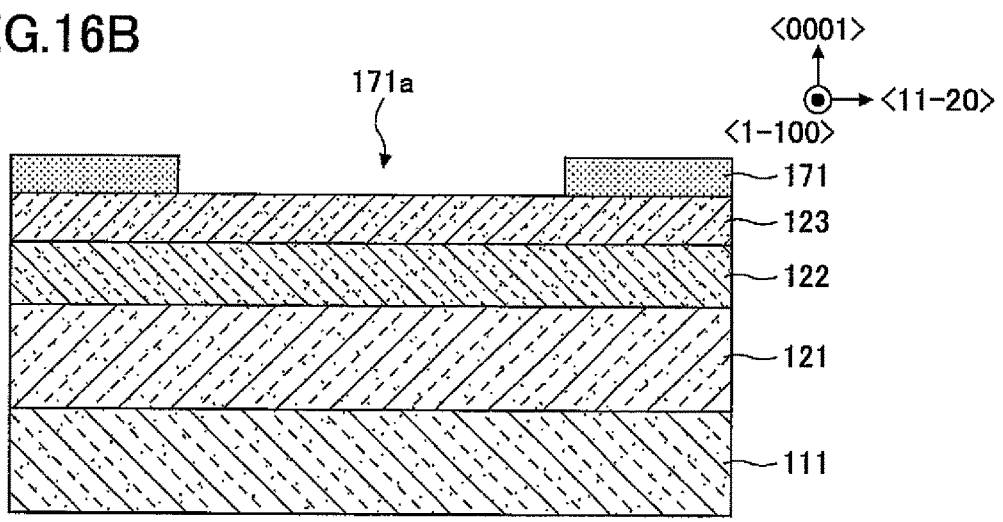

Next, as illustrated in FIG. 16B, a hard mask 171 is formed on the third semiconductor layer 123. Specifically, an Si$_3$N$_4$ film having the thickness of about 500 nm is formed on the third semiconductor layer 123 by CVD. After that, photoresist is applied on the Si$_3$N$_4$ film, which is then exposed by an exposure device and developed, a photoresist pattern (not illustrated) is formed. After that, the Si$_3$N$_4$ film is removed in a region where the photoresist pattern is not formed, by dry etching such as RIE (Reactive Ion Etching) or the like that uses a fluorine-based gas as an etching gas. Thus, the hard mask 171 is formed on the third semiconductor layer 123. After that, the photoresist pattern (not illustrated) is removed by an organic solvent or the like. Note that described above is a case where the Si$_3$N$_4$ film is removed by dry etching. Alternatively, the Si$_3$N$_4$ film may be removed by wet etching using a buffered hydrofluoric acid or the like as an etching liquid. Also, the material that forms the hard mask 171 may be SiO$_2$ formed by CVD, sputtering, SOG, and the like. The hard mask 171 formed in this way includes a finger-shaped opening 171a along the m-axis <1-100> of GaN in the third semiconductor layer 123.

Figure 16C:
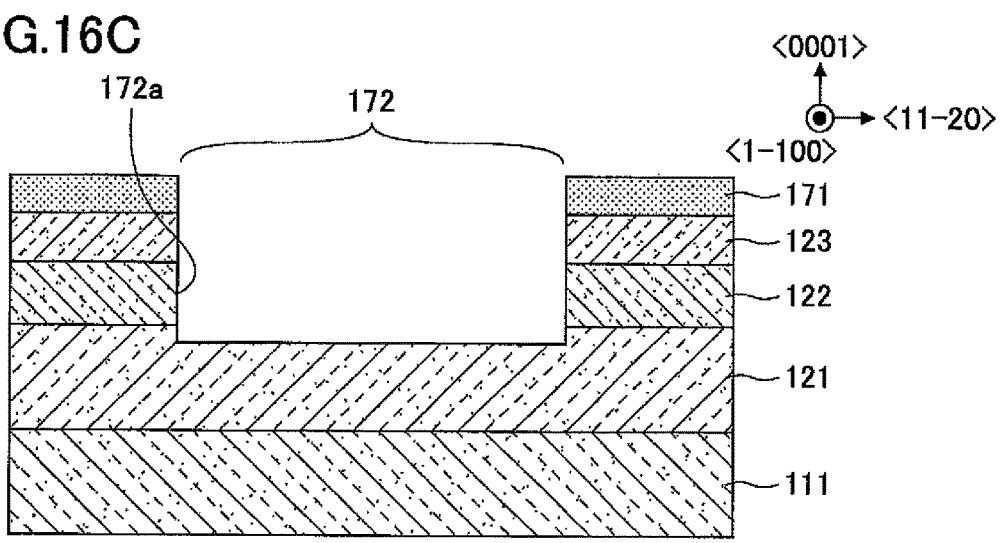

Next, as illustrated in FIG. 16C, a first opening 172 is formed by removing a part of the third semiconductor layer 123, the second semiconductor layer 122, and the first semiconductor layer 121 by dry etching such as RIE or the like using the hard mask 171 as a mask. A chlorine-based gas is used as an etching gas for this dry etching. At this moment, etching is performed so that the sidewall 172a of the opening 172 is virtually vertical to the substrate 111 to make the sidewall 172a of the first opening 172 be an a-plane (11-20) or a surface close to the a-plane (11-20). Thus, the first opening 172 is formed in which the first semiconductor layer 121 is exposed at the bottom 172b.

Figure 17A:
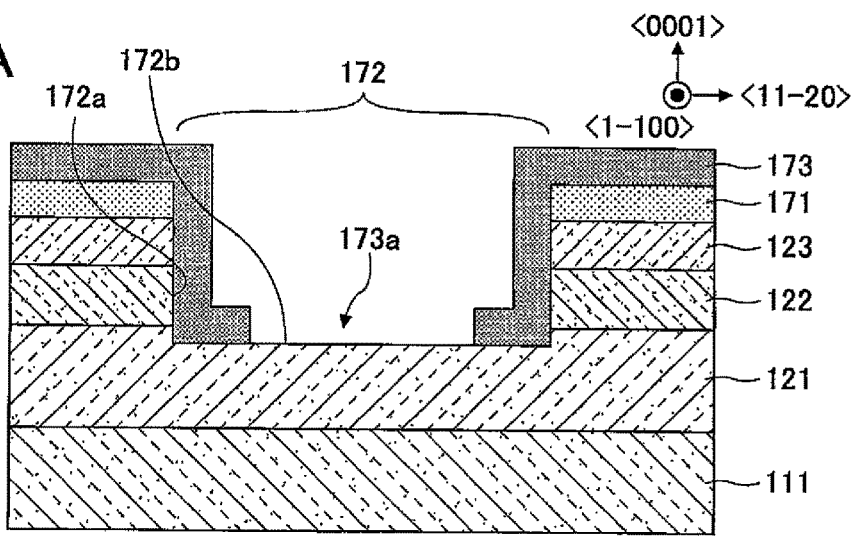
FIGS. 17A-17C are second process views illustrating the manufacturing method of the semiconductor device according to the second embodiment.

Next, as illustrated in FIG. 17A, the photoresist pattern 173 is formed on the hard mask 171, the first semiconductor layer 121 exposed on the bottom 172b of the first opening 172, and the like. This photoresist pattern 173 has the opening 173a formed at the center part of the bottom 172b of the first opening 172. Specifically, the photoresist pattern 173 is formed by applying photoresist on the hard mask 171, the first semiconductor layer 121 exposed at the bottom 172b of the first opening 172, and the like, which is then exposed by an exposure device and developed.

Figure 17B:
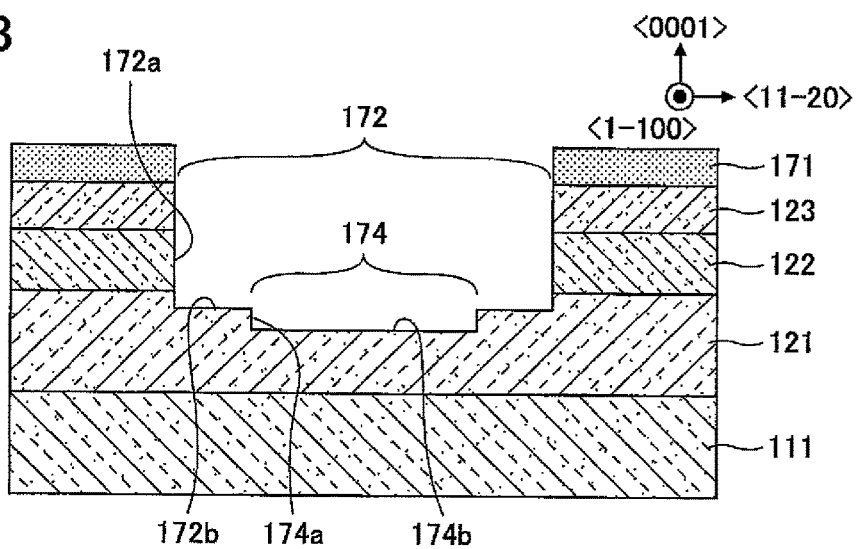

Next, as illustrated in FIG. 17B, the second opening 174 is formed by removing a part of the first semiconductor layer 121 at the opening 173a of the photoresist pattern 173 by dry etching such as RIE or the like. At this moment, the second opening 174 is formed by dry etching such as RIE or the like so that the bottom 174b of the second opening 174 is positioned several nm to several dozen nm deeper relative to the bottom 172b of the first opening 172. Thus, the sidewall 174a of the second opening 174 is formed between the bottom 172b of the first opening 172 and the bottom 174b of the second opening 174. After that, the photoresist pattern 173 is removed by an organic solvent or the like.

Figure 17C:
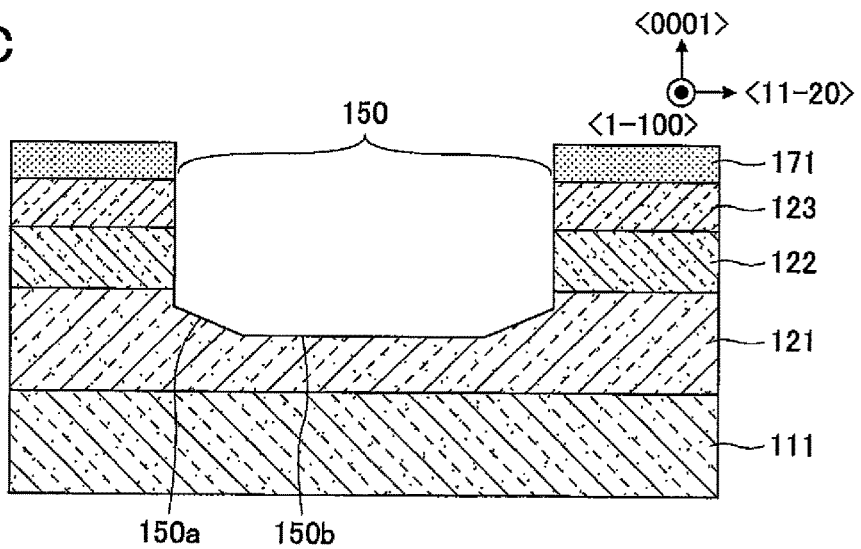

Next, as illustrated in FIG. 17C, a part of the first semiconductor layer 121 at the bottom 172b of the first opening 172 is removed by wet etching. A high-temperature KOH solvent or a TMAH (tetramethylammonium hydroxide) solvent as an etching liquid is used for this wet etching, which is, for example, a KOH solvent having the temperature at 75° C. and the concentration of 2 mol/L, or a TMAH solvent having the temperature at 75° C. and the concentration of 25%. Note that an alkaline etching liquid other than a KOH solvent or a TMAH solvent may be used as an etching liquid for this wet etching. Thus, the gate trench 150 is formed by processing the first opening 172 and the second opening 174. This gate trench 150 has the terminal parts 150a of the bottom that are formed as a slope having an angle of 10° to 30° relative to the substrate 111, and the terminal parts 150a of the bottom are formed at a position shallower than the center part 150b of the bottom. Also, the bottom 174b of the second opening 174 is hardly removed by wet etching because it is a c-plane (0001). Therefore, the bottom 174b of the second opening 174 is the center part 150b in the bottom of the gate trench 150.

Figure 20A:
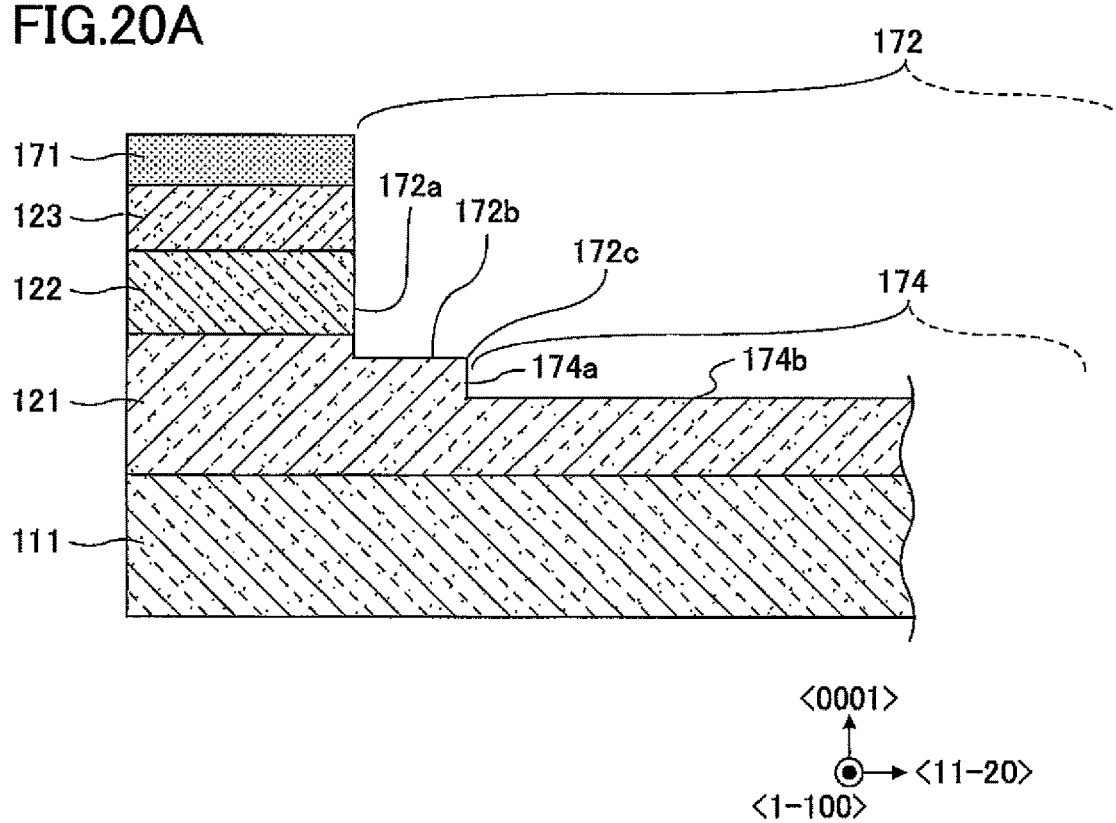
FIGS. 20A-20C are schematic views illustrating a forming method of a gate recess according to the second embodiment.
Figure 20B:
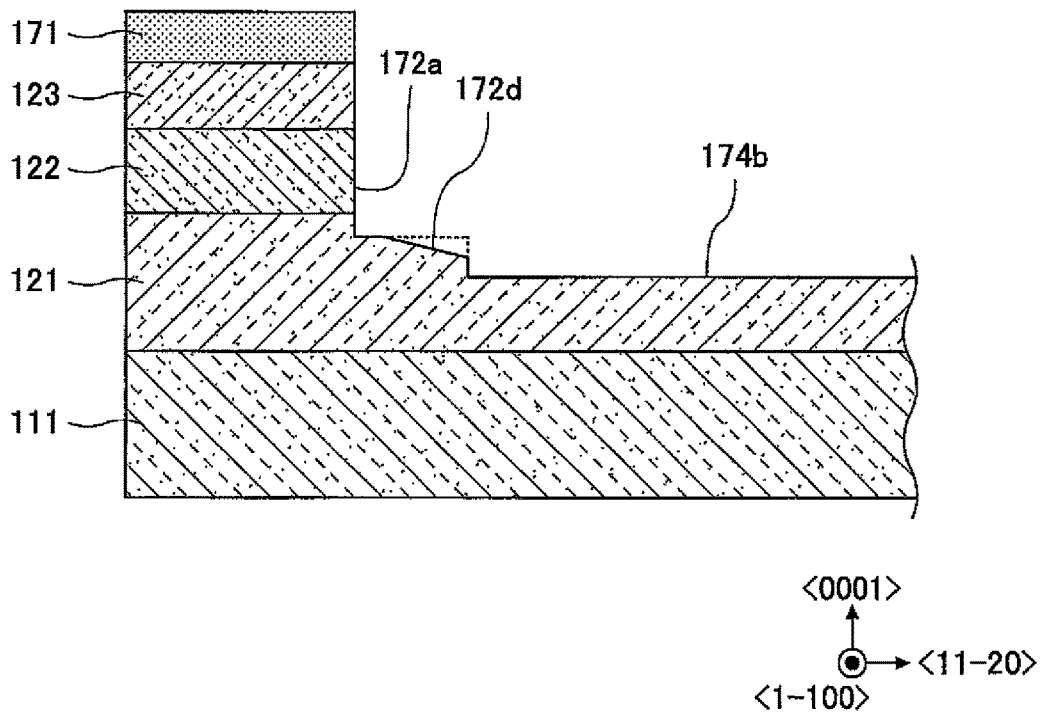

This wet etching process will be described in detail based on FIGS. 20A-20C. FIG. 20A is an enlarged view of a core part in a state illustrated in FIG. 17B. In this state, the second opening 174 is formed at the bottom 172b of the first opening 172 as described above. Also, the hard mask 171 is formed on the third semiconductor layer 123 except for the region where the first opening 172 and the second opening 174 are formed. The bottom 174b of the second opening 174 is formed at a deeper position than the bottom 172b of the first opening 172, and a stage part is formed between the bottom 174b of the second opening 174 and the bottom 172b of the first opening 172. In the present embodiment, the edge on the side of the second opening 174 in the bottom 172b of the first opening 172 will be referred to as the corner part 172c of the bottom 172b of the first opening 172. Note that, in this state, the sidewall 172a of the first opening 172 and the sidewall 174a of the second opening 174 are an a-plane (11-20) or a surface close to the a-plane (11-20). Also, the bottom 172b of the first opening 172 and the bottom 174b of the second opening 174 are a c-plane (0001) or a surface close to the c-plane (0001).

By performing wet etching using a high-temperature KOH solvent or a TMAH solvent from the state illustrated in FIG. 20A, etching proceeds gradually, starting from the corner part 172c of the bottom 172b of the first opening 172. Thus, as illustrated in FIG. 20B, a slope 172d is formed that has an angle of 10° to 30° relative to the substrate 111. At this moment, the sidewall 172a of the first opening 172 is hardly etched because the hard mask 171 is formed above.

Figure 20C:
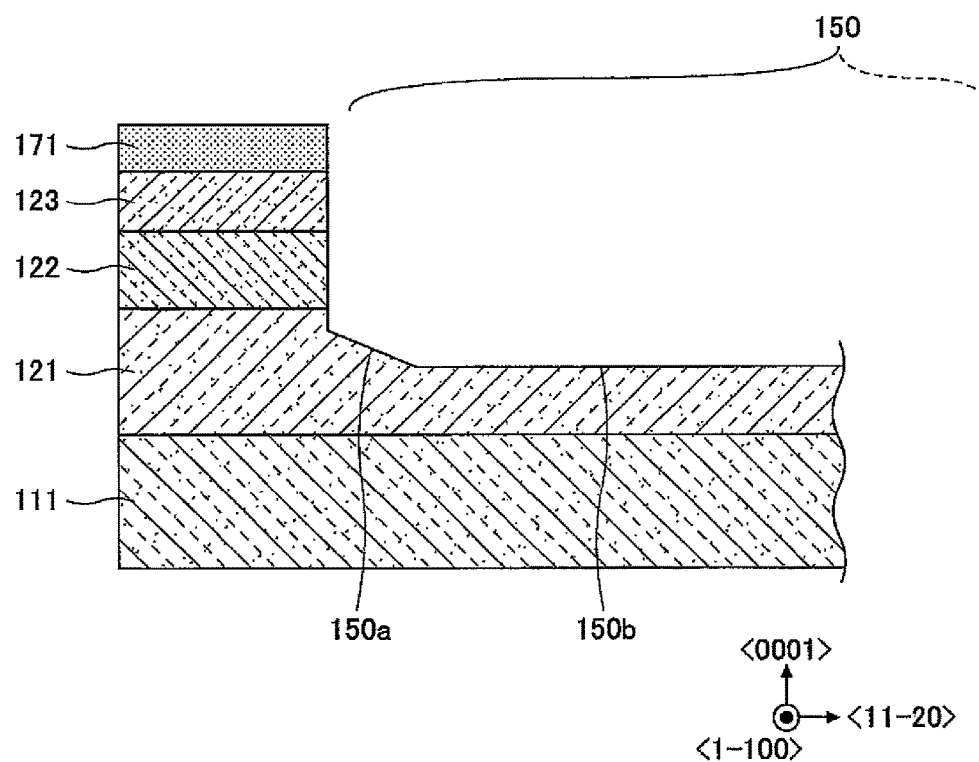

After that, by further performing wet etching, as illustrated in FIG. 20C, etching that has started from the corner part 172c of the bottom 172b of the first opening 172 proceeds further, which makes the slope 172d connect with the bottom 174b of the second opening 174. Thus, the gate trench 150 is formed. In this gate trench 150, the terminal parts 150a are formed with the slopes 172d at the bottom, and the center part 150b of the bottom is formed by the bottom 174d of the second opening 174. Namely, the bottom 172b of the first opening 172 is a c-plane (0001) or a surface close to the c-plane (0001), and the sidewall of the second opening 174 is an a-plane (11-20) or a surface close to the a-plane (11-20). Therefore, Ga at the corner part 172c at the bottom 172b of the first opening 172 has a dangling bond as illustrated in FIG. 10, and Ga having such a dangling bond tends to be removed, which makes the etching proceed from such a part.

Figure 21:
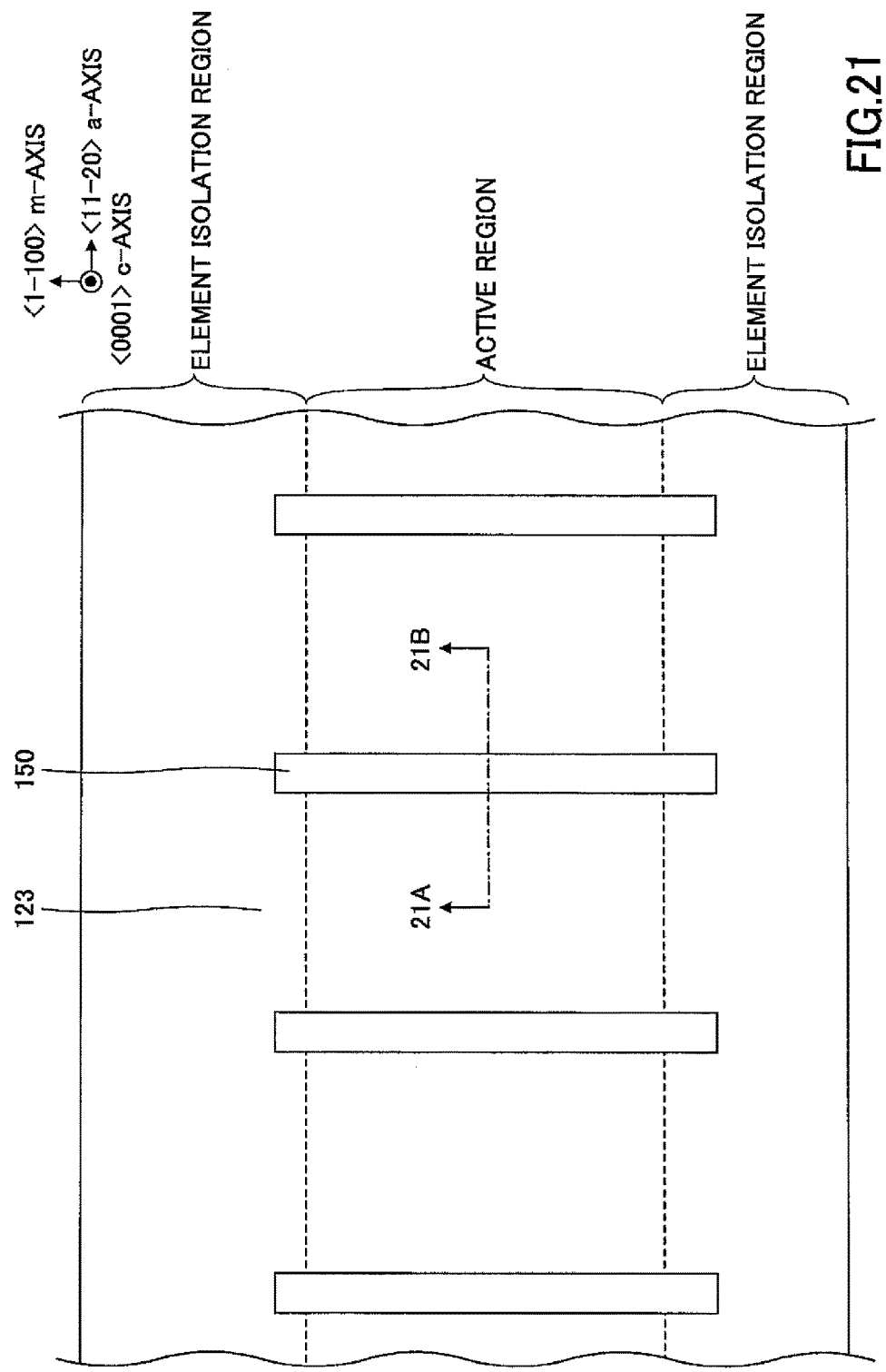
FIG. 21 is a first top view of the manufacturing process of the semiconductor device according to the second embodiment.

Next, the hard mask 171 is removed by wet etching as illustrated in FIG. 18A. For this wet etching, a hydrofluoric acid or the like is used as an etching liquid. Note that FIG. 21 is a top view in this state, and FIG. 18A is a cross-sectional view taken along the dashed-dotted line 21A-21B of FIG. 11.

Next, as illustrated in FIG. 18B, the drain electrode 143 is formed on the back of the substrate 111, namely, the other side of the surface. Specifically, a stacked metal film made of Ti/Al is formed by vacuum deposition to form the drain electrode 143. In the stacked metal film, a Ti film having the thickness of about 10 nm and an Al film having the thickness of about 300 nm are stacked.

Figure 22:
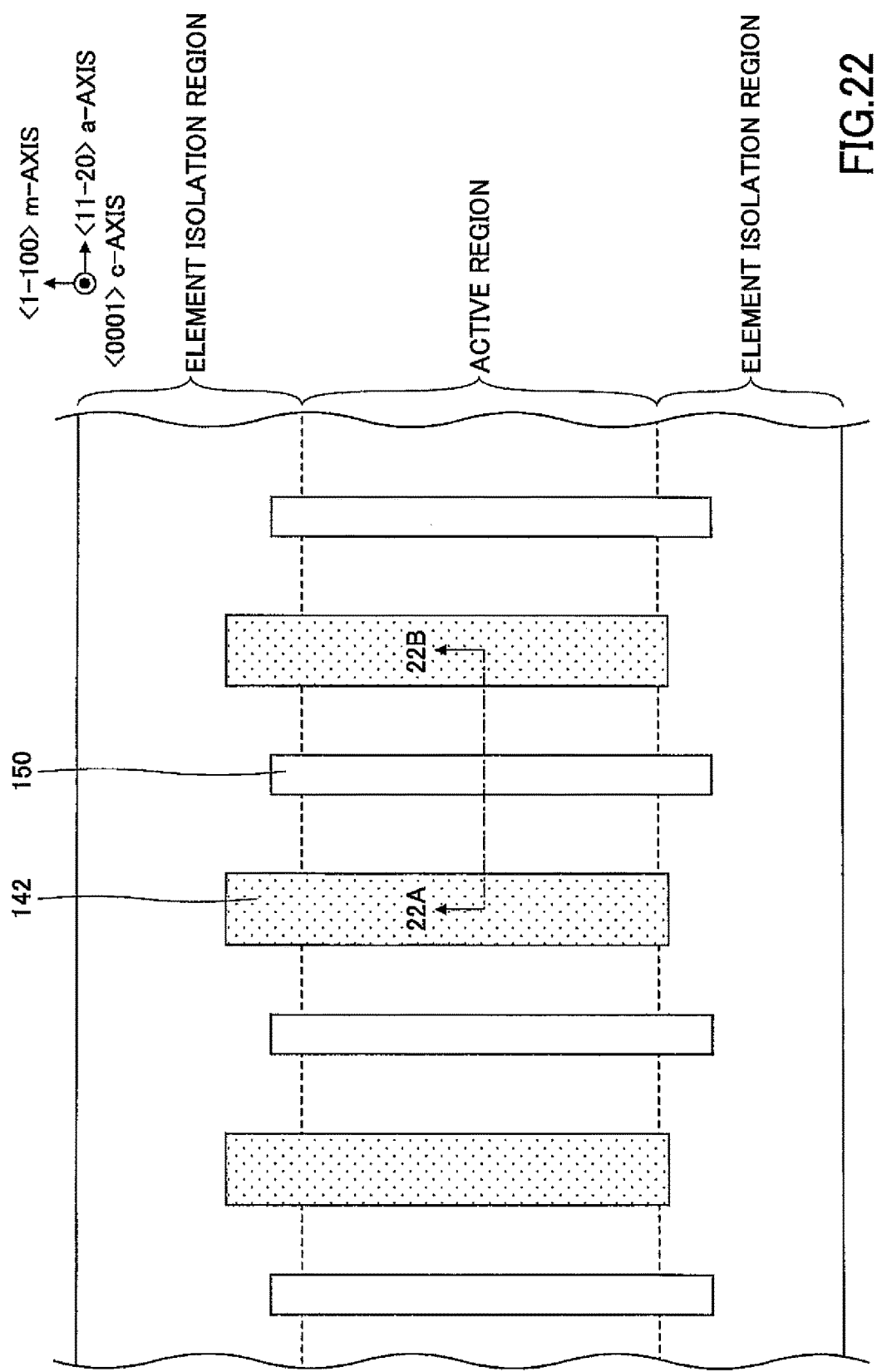
FIG. 22 is a second top view of the manufacturing process of the semiconductor device according to the second embodiment.
Figure 23:
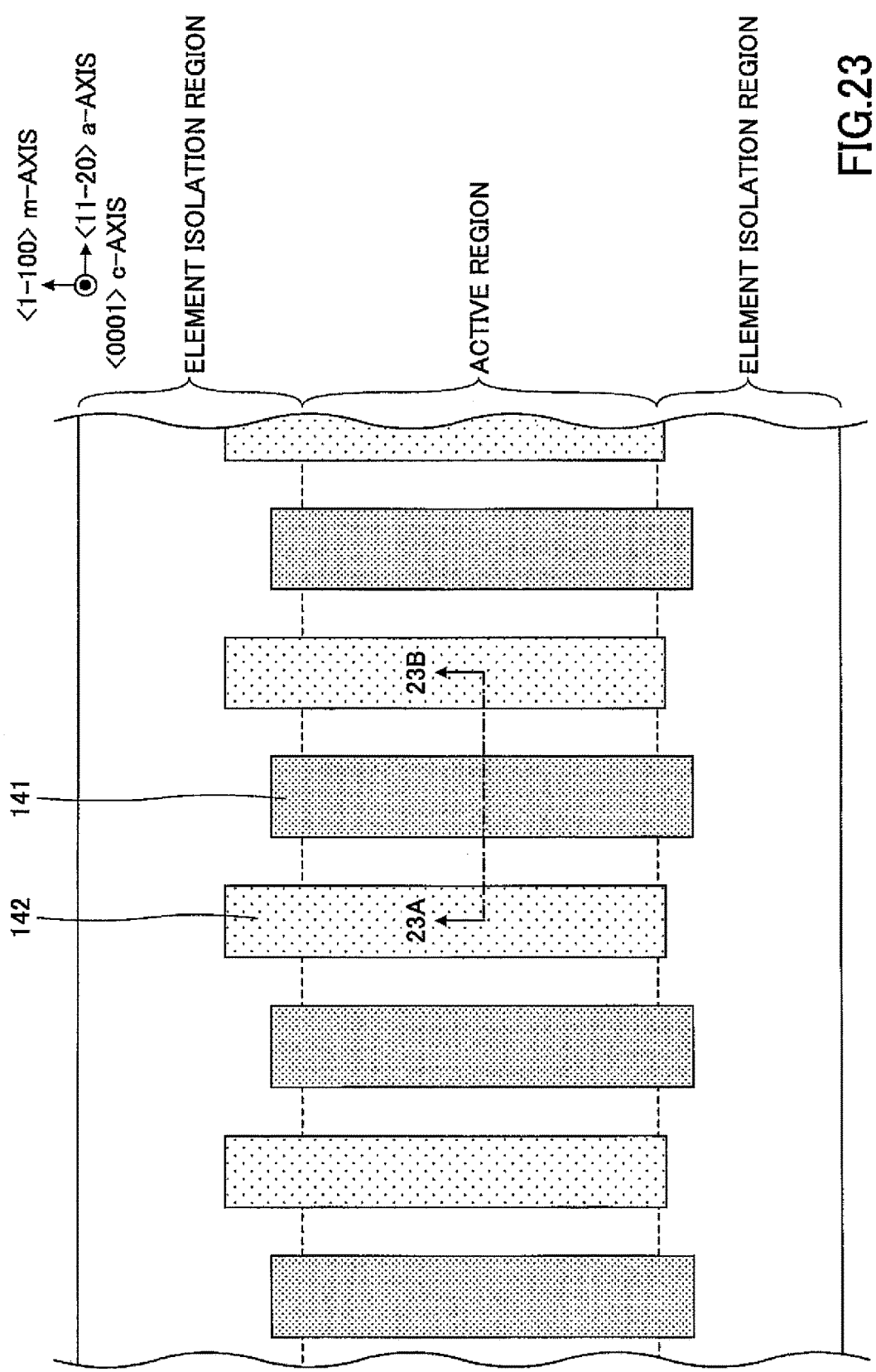
FIG. 23 is a third top view of the manufacturing process of the semiconductor device according to the second embodiment.

Next, as illustrated in FIG. 18C, the source electrodes 142 are formed. Specifically, by applying photoresist on the third semiconductor layer 123 and the first semiconductor layer 121 in the gate trench 150, which is then exposed by an exposure device and developed, a photoresist pattern (not illustrated) is formed that has openings in regions where the source electrodes 142 are to be formed. After that, a stacked metal film made of Ti/Al is formed on the surface where the photoresist pattern is formed by vacuum deposition. In the stacked metal film, a Ti film having the thickness of about 10 nm and an Al film having the thickness of about 300 nm are stacked. After that, by dipping into an organic solvent or the like, the stacked metal film formed on the photoresist pattern is removed by liftoff, along with the photoresist pattern. Thus, the source electrodes 142 are formed with the remaining stacked metal film. After that, heat treatment is applied in a nitrogen atmosphere at a temperature of 400° C. to 1000° C., for example, at the temperature of 700° C. Thus, an ohmic contact is established between the source electrodes 142 and the drain electrode 143. Note that FIG. 22 is a top view in this state and FIG. 18C is a cross-sectional view taken along the dashed-dotted line 22A-22B of FIG. 22.

Figure 19A:
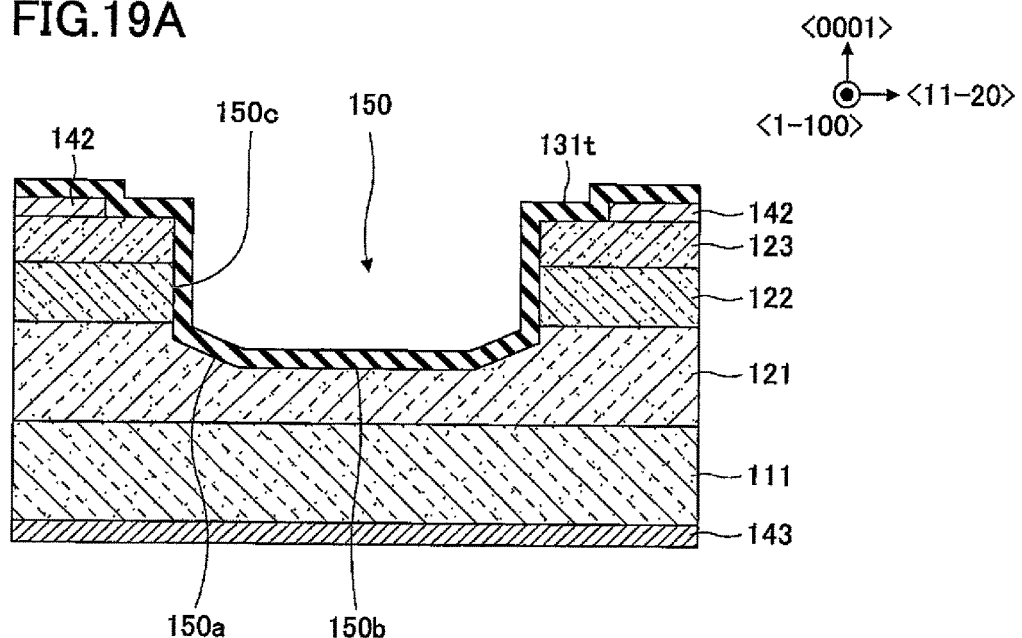

Next, as illustrated in FIG. 19A, the insulation film 131t is formed on the first semiconductor layer 121 and the like in a region where the gate trench 150 is formed, and on the third semiconductor layer 123. Specifically, the insulation film 131t is formed by forming a film of $Al_2O_3$ having the thickness of about 50 nm by ALD (Atomic Layer Deposition). The insulation film 131t may be formed of materials other than $Al_2O_3$ as long as it is an oxide or a nitride, for example, one or more materials selected among $SiO_2$, $HfO_2$, $Ga_2O_3$, $Si_3N_4$, and the like. Further, these materials may be stacked to form the film.

Figure 19B:
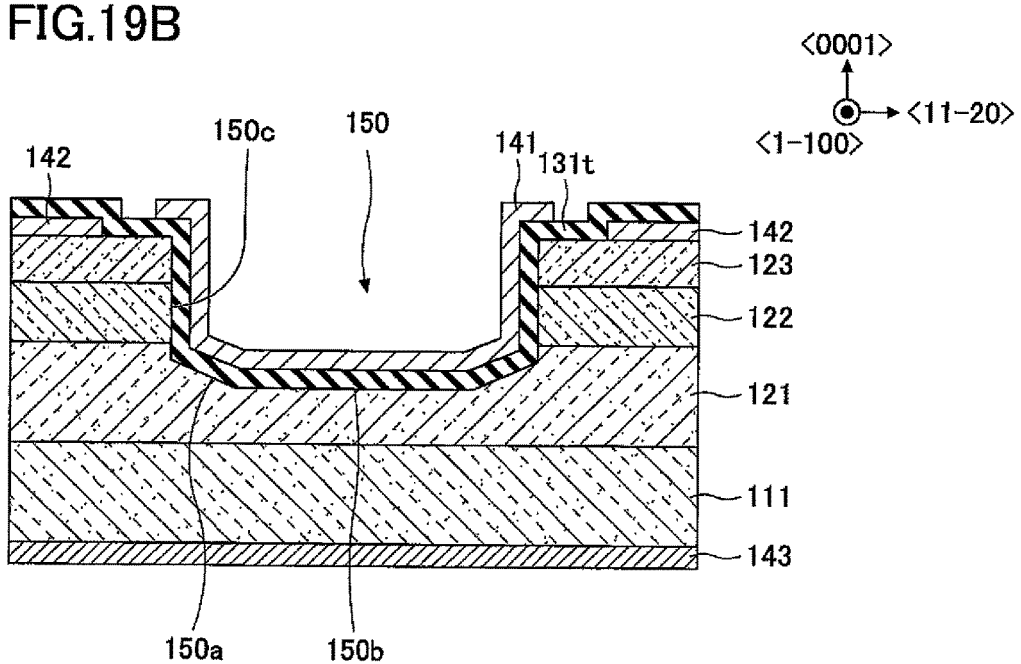

Next, as illustrated in FIG. 19B, the gate electrode 141 is formed. Specifically, by applying photoresist on the surface of the insulation film 131t, which is then exposed by an exposure device and developed, a photoresist pattern (not illustrated) is formed that has an opening in a region where the gate electrode 141 is to be formed. After that, a stacked metal film made of Ni/Au is formed on the surface where the photoresist pattern is formed by vacuum deposition. After that, by dipping into an organic solvent or the like, the stacked metal film formed on the photoresist pattern is removed by liftoff, along with the photoresist pattern. Thus, the gate the electrode 141 is formed with the remaining stacked metal film in the gate trench 150.

Next, as illustrated in FIG. 19C, the source electrodes 142 are exposed by removing the insulation film 131t that covers the source electrodes 142. Specifically, by applying photoresist on the insulation film 131t, which is then exposed by an exposure device and developed, a photoresist pattern (not illustrated) is formed that has openings in regions where the source electrodes 142 are to be exposed. After that, the insulation film 131t is removed in the regions where the photoresist pattern is not formed, by dry etching or wet etching, to form the insulation layer 131 as a gate insulation film. Note that the insulation film 131t may be removed by ion milling or the like if the insulation film 131t is formed of $Al_2O_3$. Also, the photoresist pattern (not illustrated) is removed by an organic solvent or the like.

After that, an interlayer insulating film (not illustrated) may be formed to form wiring and the like. Also, a body diode may be formed by having a part of the source electrode 142 contact p-GaN in the second semiconductor layer 122 or the like.

The semiconductor device in the present embodiment can be manufactured by the above process.

Third Embodiment

Next, the third embodiment will be described. The present embodiment relates to a semiconductor device, a power source device, and a high-frequency amplifier.

Figure 24:
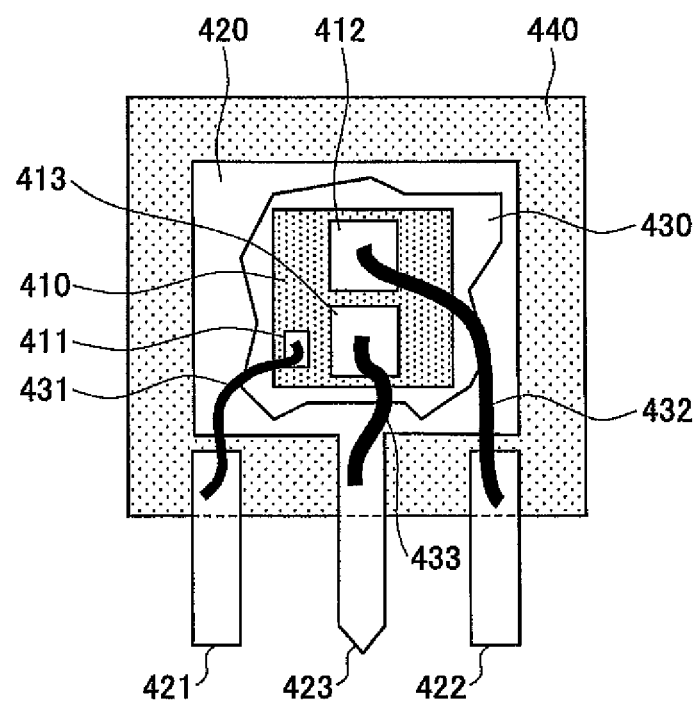
FIG. 24 is a schematic view illustrating a semiconductor device in a discrete package according to a third embodiment.

The semiconductor device in the present embodiment is a semiconductor device according to the first or second embodiment which is contained in a discrete package, and the discretely packaged semiconductor device will be described based on FIG. 24. Note that FIG. 24 schematically illustrates the inside of the discretely packaged semiconductor device in which positions of the electrodes and the like may be different from those in the first or second embodiment. Also, in the present embodiment, there are cases where it is assumed that a single HEMT or a single transistor having the UMOS structure is formed in the first or second embodiment as a semiconductor device.

First, a semiconductor device manufactured according to the first or second embodiment is cut off by dicing or the like to form a semiconductor chip 410, which is a HEMT or the like made of GaN semiconductor materials. The semiconductor chip 410 is fixed on a lead frame 420 by a die attachment agent 430 such as solder or the like. Note that the semiconductor chip 410 corresponds to one of the semiconductor devices in the first and second embodiments.

Next, a gate electrode 411 is connected with a gate lead 421 by a bonding wire 431, a source electrode 412 is connected with a source lead 422 by a bonding wire 432, and a drain electrode 413 is connected with a drain lead 423 by a bonding wire 433. Note that the bonding wires 431, 432, and 433 are formed of a metal material such as Al. Also, the gate electrode 411 is a gate electrode pad in the present embodiment, which is connected with the gate electrode 41 of a semiconductor device according to the first embodiment, or the gate electrode 141 of a semiconductor device according to the second embodiment. Also, the source electrode 412 is a source electrode pad, which is connected with the source electrode 42 of the semiconductor device according to the first embodiment, or the source electrode 142 of the semiconductor device according to the second embodiment. Also, the drain electrode 413 is a drain electrode pad, which is connected with the drain electrode 43 of the semiconductor device according to the first embodiment, or the drain electrode 143 of the semiconductor device according to the second embodiment.

Next, resin sealing is performed by a transfer molding method using a mold resin 440. Thus, the HEMT or the like using GaN semiconductor materials can be manufactured as the discretely packaged semiconductor device.

Next, a power source device and a high-frequency amplifier will be described according to the present embodiment. The power source device and the high-frequency amplifier in the present embodiment are a power source device and a high-frequency amplifier that use one of the semiconductor devices in the first and second embodiments, respectively.

Figure 25:
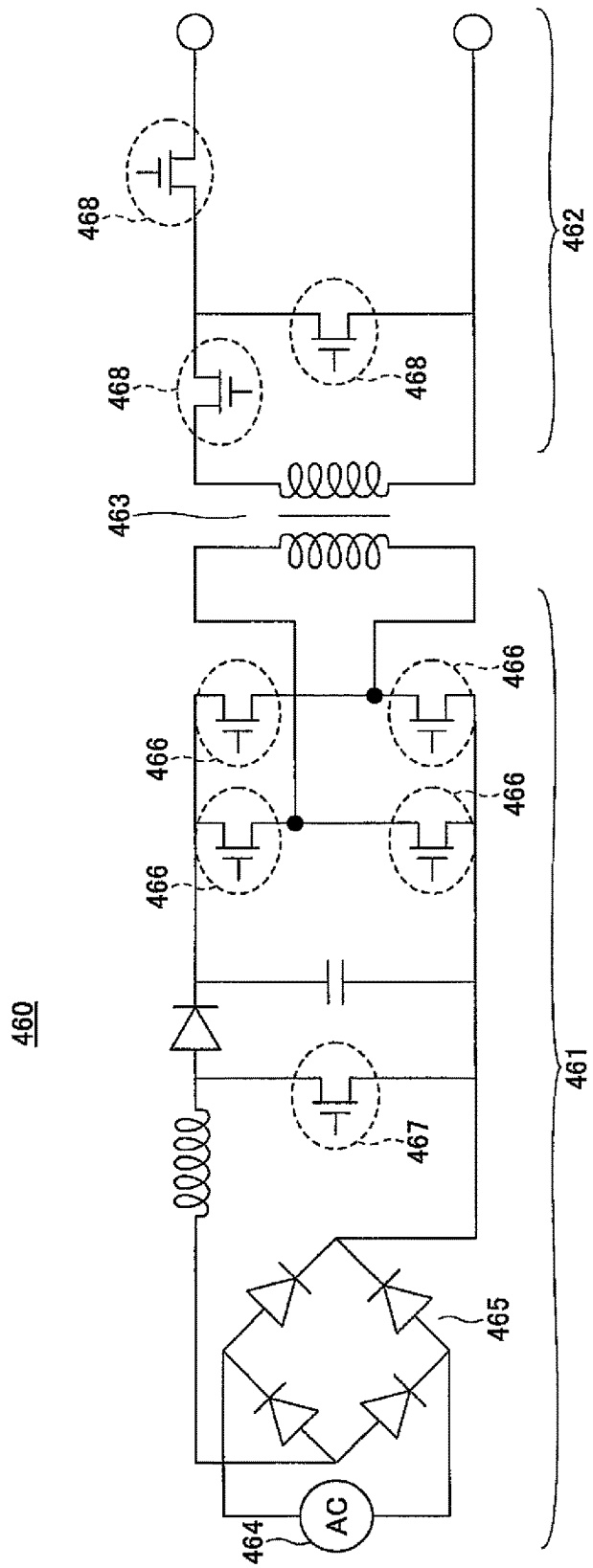
FIG. 25 is a circuit diagram illustrating a power source device according to the third embodiment.

First, the power source device in the present embodiment will be described based on FIG. 25. A power source device 460 in the present embodiment includes a high-voltage primary circuit 461, a low-voltage secondary circuit 462, and a transformer 463 disposed between the primary circuit 461 and the secondary circuit 462. The primary circuit 461 includes an AC power supply 464, a what-is-called bridge rectifier circuit 465, multiple switching elements 466 (four in the example illustrated in FIG. 25) and a switching element 467. The secondary circuit 462 includes multiple switching elements 468 (three in the example illustrated in FIG. 25). In the example illustrated in FIG. 25, semiconductor devices according to the first or second embodiment are used as the switching elements 466 and 467 in the primary circuit 461. Note that it is preferable that the switching elements 466 and 467 in the primary circuit 461 are normally-off semiconductor devices. Also, the switching elements 468 used in the secondary circuit 462 use usual MISFETs (metal insulator semiconductor field effect transistor) formed of silicon, respectively.

Figure 26:
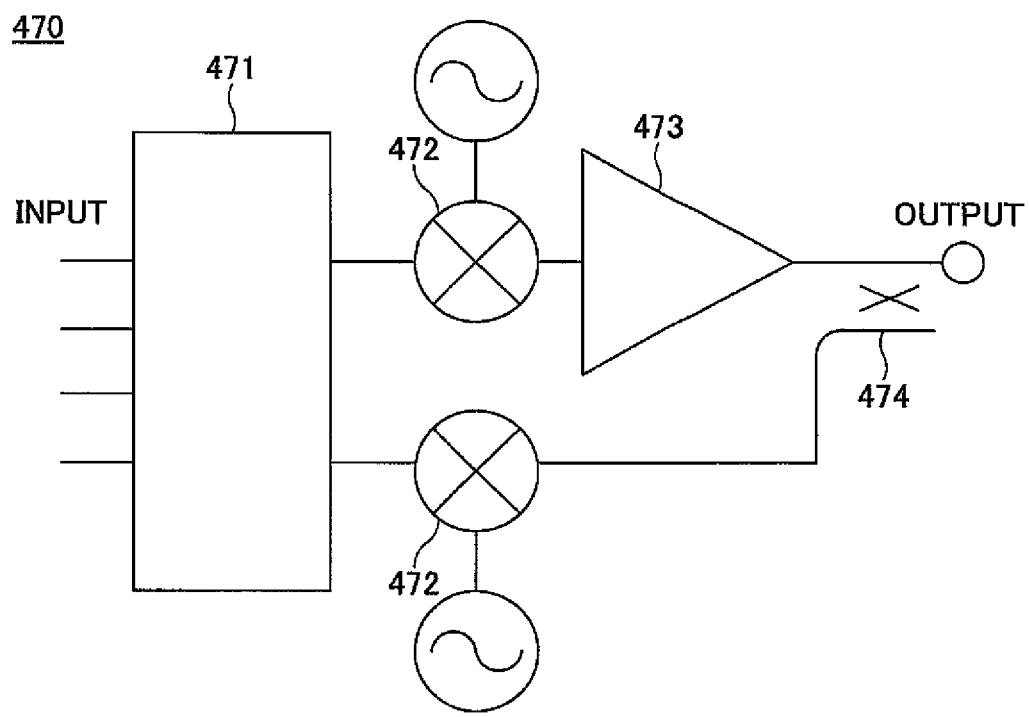
FIG. 26 is a schematic view illustrating a structure of a high-output amplifier according to the third embodiment.

Next, the high-frequency amplifier in the present embodiment will be described based on FIG. 26. A high-frequency amplifier 470 in the present embodiment may be used as, for example, a power amplifier for a base station for cellular phones. This high-frequency amplifier 470 includes a digital predistortion circuit 471, mixers 472, a power amplifier 473, and a directional coupler 474. The digital predistortion circuit 471 compensates for non-linear distortion of an input signal. The mixers 472 mix the input signal that has non-linear distortion compensated for, with an alternating current signal. The power amplifier 473 amplifies the input signal having been mixed with the alternating current signal. In the example illustrated in FIG. 26, the power amplifier 473 includes a semiconductor device according to the first or second embodiment. The directional coupler 474 monitors an input signal and an output signal. In the circuit illustrated in FIG. 26, by turning on/off the switching elements, for example, it is possible to mix the output signal with the alternating current signal by using the mixers 472, and to transmit the mixed signal to the digital predistortion circuit 471.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A manufacturing method of a semiconductor device, comprising:
    forming a first semiconductor layer of first conductivity-type made of a nitride semiconductor on a surface of a substrate having conductivity, forming a second semiconductor layer of a second conductivity-type made of a nitride semiconductor on the first semiconductor layer, and forming a third semiconductor layer of the first conductivity-type made of a nitride semiconductor on the second semiconductor layer;
    forming a first opening in the third semiconductor layer, the second semiconductor layer, and the first semiconductor layer by dry etching;
    forming a second opening at a bottom of the first opening by dry etching, and forming a corner part formed with the bottom of the first opening as a c-plane and a sidewall of the second opening as an a-plane;
    forming a slope by removing the corner part by wet etching after having the second opening formed, to form a gate trench;
    forming an insulation layer at the gate trench;
    forming a gate electrode on the insulation layer formed at the gate trench;
    forming a source electrode on the third semiconductor layer; and
    forming a drain electrode on another surface of the substrate.

2. The manufacturing method as claimed in claim 1, wherein the first semiconductor layer, the second semiconductor layer, and the third semiconductor layer are made of materials including GaN, respectively.

3. The manufacturing method as claimed in claim 1, wherein the forming the first semiconductor layer, the second semiconductor layer, and the third semiconductor layer respectively form the first semiconductor layer, the second semiconductor layer, and the third semiconductor layer by MOCVD.

4. The manufacturing method as claimed in claim 1, wherein a sidewall of the gate trench is formed by the a-plane.

5. The manufacturing method as claimed in claim 1, wherein the wet etching uses KOH or TMAH as an etchant.

* * * * *